(12) United States Patent
Hsu et al.

(10) Patent No.: US 10,310,386 B2
(45) Date of Patent: Jun. 4, 2019

(54) OPTIMIZATION OF ASSIST FEATURES AND SOURCE

(71) Applicant: ASML Netherlands B.V., Veldhoven (NL)

(72) Inventors: Duan-Fu Stephen Hsu, Fremont, CA (US); Feng-Liang Liu, Shenzhen (CN)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/325,428

(22) PCT Filed: Jun. 29, 2015

(86) PCT No.: PCT/EP2015/064742
§ 371 (c)(1),
(2) Date: Jan. 10, 2017

(87) PCT Pub. No.: WO2016/008711
PCT Pub. Date: Jan. 21, 2016

(65) Prior Publication Data
US 2017/0184979 A1 Jun. 29, 2017

Related U.S. Application Data

(60) Provisional application No. 62/115,506, filed on Feb. 12, 2015, provisional application No. 62/024,324, filed on Jul. 14, 2014.

(51) Int. Cl.
*G06F 17/50* (2006.01)
*G03F 7/20* (2006.01)
(Continued)

(52) U.S. Cl.
CPC ............ *G03F 7/70433* (2013.01); *G03F 1/36* (2013.01); *G03F 1/70* (2013.01); *G03F 7/7085* (2013.01);
(Continued)

(58) Field of Classification Search
CPC ............ G03F 7/70433; G03F 7/70483; G03F 7/7085; G03F 1/36; G03F 7/70425;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 1480985 | 3/2004 |
| CN | 1828613 | 9/2006 |

(Continued)

OTHER PUBLICATIONS

International Search Report and Written Opinion dated Dec. 17, 2015 in corresponding International Patent Application No. PCT/EP2015/064742.

(Continued)

*Primary Examiner* — Jack Chiang
*Assistant Examiner* — Brandon Bowers
(74) *Attorney, Agent, or Firm* — Pillsbury Winthrop Shaw Pittman LLP

(57) ABSTRACT

Methods of reducing a pattern displacement error, contrast loss, best focus shift, and/or tilt of a Bossung curve of a portion of a design layout used in a lithographic process for imaging that portion onto a substrate using a lithographic apparatus. The methods include adjusting an illumination source of the lithographic apparatus, placing one or more assist features onto, or adjusting a position and/or shape of one or more existing assist features in, the portion. Adjusting the illumination source and/or the one or more assist features may be by an optimization algorithm.

20 Claims, 32 Drawing Sheets

(51) Int. Cl.
  *G03F 1/70* (2012.01)
  *G03F 1/36* (2012.01)
(52) U.S. Cl.
  CPC ...... *G03F 7/70125* (2013.01); *G03F 7/70425* (2013.01); *G03F 7/70441* (2013.01); *G03F 7/70483* (2013.01); *G06F 17/5081* (2013.01)
(58) Field of Classification Search
  CPC .... G03F 1/70; G03F 7/70441; G03F 7/70125; G06F 17/5081
  USPC .......................................................... 716/55
  See application file for complete search history.

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 6,777,147 | B1 * | 8/2004 | Fonseca ............... G03F 7/70466 430/30 |
| 6,809,797 | B2 | 10/2004 | Baselmans et al. |
| 7,003,758 | B2 | 2/2006 | Ye et al. |
| 7,200,835 | B2 | 4/2007 | Zhang et al. |
| 7,475,382 | B2 | 1/2009 | Melvin et al. |
| 7,587,704 | B2 | 9/2009 | Ye et al. |
| 8,182,969 | B2 * | 5/2012 | Hsu ............................ G03F 1/36 430/30 |
| 8,200,468 | B2 | 6/2012 | Ye et al. |
| 8,438,508 | B2 | 5/2013 | Liu |
| 8,554,510 | B2 | 10/2013 | Staals et al. |
| 8,786,824 | B2 | 7/2014 | Hansen |
| 2002/0155357 | A1 | 10/2002 | Lacour |
| 2005/0136340 | A1 * | 6/2005 | Baselmans .......... G03F 7/70433 430/5 |
| 2005/0251771 | A1 | 11/2005 | Robles |
| 2006/0188673 | A1 | 8/2006 | Melvin et al. |
| 2006/0190919 | A1 | 8/2006 | Zhang et al. |
| 2010/0315614 | A1 | 12/2010 | Hansen |
| 2014/0038087 | A1 | 2/2014 | Gallagher et al. |
| 2014/0040838 | A1 * | 2/2014 | Liu ..................... G06F 17/5068 716/53 |
| 2017/0082927 | A1 | 3/2017 | Hsu et al. |

FOREIGN PATENT DOCUMENTS

| | | |
|---|---|---|
| CN | 101164070 | 4/2008 |
| TW | 512427 | 12/2002 |
| TW | 201131314 | 9/2011 |
| WO | WO 2010/059954 | 5/2010 |
| WO | WO 2015/139951 | 9/2015 |

OTHER PUBLICATIONS

Liu, Xiaofeng et al., "EUV source-mask optimization for 7nm node and beyond", Proceedings of SPIE, vol. 9048, pp. 90480Q-1-90480Q-11 (Apr. 17, 2014).

Hsu, Stephen, "An Innovative Source-Mask co-Optimization (SMO) Method for Extending Low k1 Imaging", Proceedings of SPIE, vol. 7140, pp. 714010-1-714010-10 (2008).

Burkhardt, Martin et al., "Clear Sub-Resolution Assist Features for EUV",Proceedings of SPIE, vol. 9048, pp. 904838-1-904838-7 (Apr. 17, 2014).

Spence, Chris, "Full-Chip Lithography Simulation and Design Analysis—How OPC Is Changing IC Design," Proceedings of SPIE, vol. 5751, pp. 1-14 (2005).

Cao, Yu et al., "Optimized Hardware and Software for Fast, Full Chip Simulation," Proceedings of SPIE, vol. 5754, pp. 407-414 (2005).

Rosenbluth, Alan E. et al., "Optimum Mask and Source Patterns to Print a Given Shape," J. Microlith., Microfab., Microsys., vol. 1, No. 1, pp. 13-30 (2002).

Socha, Robert et al., "Simultaneous Source Mask Optimization (SMO)," Proceedings of SPIE, vol. 5853, pp. 180-193 (2005).

Granik, Yuri, "Source Optimization for Image Fidelity and Throughput," J. Microlith., Microfab., Microsys., vol. 3, No. 4, pp. 509-522 (2004).

Office Action issued in corresponding U.S. Appl. No. 15/512,540, dated Jun. 1, 2018.

Disclosed Anonymously, "Defect Prediction," Research Disclosure, Database No. 604033, pp. 1-7 (Jul. 18, 2014).

Huang, Thomas et al., "Improvement of lithography process by using a FlexRay illuminator for memory applications," Proc. of SPIE, vol. 7973, pp. 79731X-1-79731X-11 (2011).

Kang, Hoyoung, et al.: "Novel assist feature design to improve depth of focus in low k1 EUV lithography", Proc. of SPIE, vol. 7520, pp. 752037-1-752037-7 (2009).

Hsu, Stephen, et al.: "EUV Resolution Enhancement Techniques (RETs) for k1 0.4 and below", Proc. of SPIE, vol. 9422, pp. 942211-1-942211-16 (2015).

Ng, Philip C.W., et al.: "Fully model-based methodology for simultaneous correction of extreme ultraviolet mask shadowing and proximity effects", J. Micro/Nanolith. MEMS MOEMS, Jan.-Mar. 2011, vol. 10(1), pp. 013004-1-013004-13.

* cited by examiner

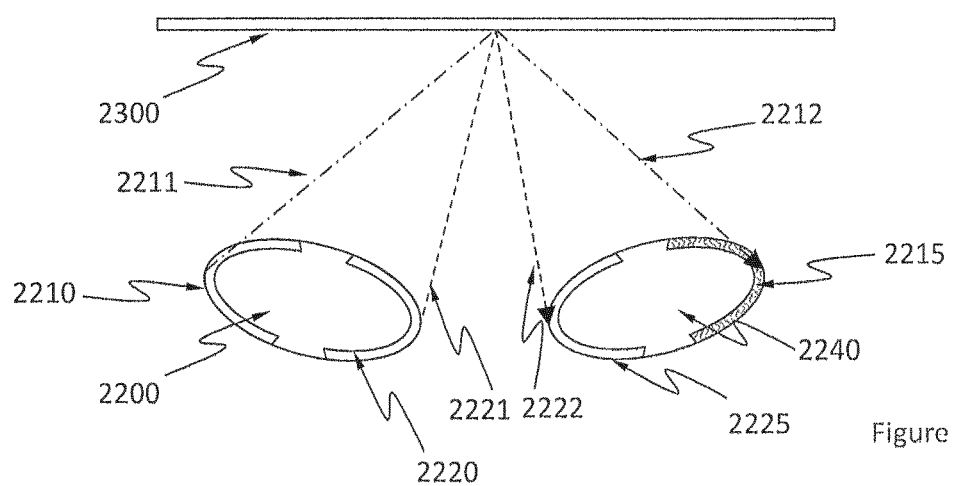
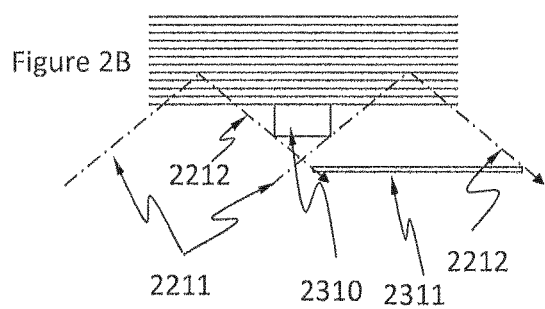
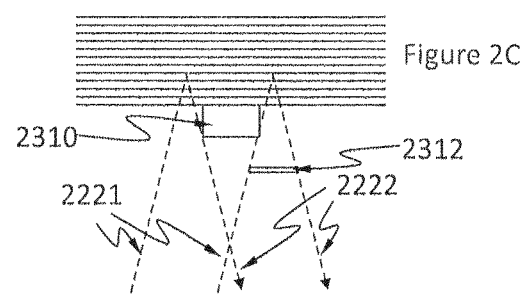
Figure 2A
Figure 2B
Figure 2C

F=0.04μm    F=0.06μm $t_m(x,y)$ $t_m(x,y)$

OPTIMIZATION OF ASSIST FEATURES AND SOURCE

CROSS REFERENCE TO RELATED APPLICATIONS

This application is the U.S. national phase entry of PCT patent application no. PCT/EP2015/064742, which was filed on Jun. 29, 2015 which claims the benefit of priority of U.S. Provisional Patent Application No. 62/024,324, filed Jul. 14, 2014 and U.S. Provisional Application No. 62/115,506 filed Feb. 12, 2015, which are incorporated by reference herein their entirety.

TECHNICAL FIELD

The description herein relates to lithographic apparatuses and processes, and more particularly to a method or tool for optimization of an illumination source or patterning device for use in a lithographic apparatus or process.

BACKGROUND

A lithographic apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic apparatus, one target portion at a time. In one type of lithographic apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a computer-implemented method to improve a lithographic process for imaging a portion of a design layout onto a substrate using a lithographic apparatus, the method comprising: reducing one or more pattern displacement errors, contrast loss, best focus shift, tilt of a Bossung curve of the portion, or a combination thereof, improving exposure latitude, or enlarging depth of focus, by adjusting one or more characteristics of an illumination source of the lithographic apparatus; calculating a continuous transmission map of the portion; identifying numbers, positions and shapes of one or more assist features from the continuous transmission map; placing the one or more assist features onto the patterning device.

Disclosed herein is a computer-implemented method to improve a lithographic process for imaging a portion of a design or test structure layout onto a substrate using a lithographic apparatus, the method comprising: reducing one or more pattern displacement errors, contrast loss, best focus shift, tilt of a Bossung curve of the portion, or a combination thereof, improving exposure latitude, or enlarging depth of focus, by adjusting one or more characteristics of an illumination source of the lithographic apparatus; obtaining one or more rules that determine one or more characteristics of one or more assist features based on one or more characteristics of a main feature in the portion; determining numbers, positions and shapes the one or more assist features using the one or more rules; placing the one or more assist features onto the patterning device.

Disclosed herein is a computer-implemented method to improve a lithographic process for imaging a portion of a design layout onto a substrate using a lithographic apparatus, the method comprising: reducing one or more pattern displacement errors, contrast loss, best focus shift, tilt of a Bossung curve of the portion, or a combination thereof, improving exposure latitude, or enlarging depth of focus, by adjusting one or more characteristics of an illumination source of the lithographic apparatus; reducing one or more pattern displacement errors, contrast loss, tilt of a Bossung curve of the portion, or a combination thereof, by adjusting one or more characteristics of the portion.

Disclosed herein is a computer-implemented method to improve a lithographic process for imaging a portion of a design layout onto a substrate using a lithographic apparatus, the method comprising: computing a multi-variable cost function of a plurality of design variables that are characteristics of the lithographic process, wherein the multi-variable cost function is a function of one or more pattern displacement errors, contrast loss, best focus shift, tilt of a Bossung curve of the portion, exposure latitude, depth of focus, or a combination thereof; and reconfiguring the characteristics of the lithographic process by adjusting the design variables until a termination condition is satisfied.

Disclosed herein is a computer-implemented method to improve a lithographic process for imaging a portion of a design layout onto a substrate using a lithographic apparatus, the method comprising: computing a multi-variable cost function of a plurality of design variables that are characteristics of the lithographic process; and reconfiguring the characteristics of the lithographic process by adjusting the design variables until a predefined termination condition is satisfied, under one or more constraints on one or more pattern displacement errors, contrast loss, best focus shift, tilt of a Bossung curve of the portion, or a combination thereof.

According to an embodiment, the one or more pattern displacement errors are pattern-dependent.

According to an embodiment, the multi-variable cost function is an explicit function of the one or more pattern displacement errors, contrast loss, best focus shift, tilt of a Bossung curve of the portion, or a combination thereof.

According to an embodiment, adjusting one or more characteristics of an illumination source changes a symmetry of the illumination source.

According to an embodiment, the portion comprises one or more assist features, and wherein adjusting the one or more characteristics of the portion comprises adjusting shapes, numbers, positions, or a combination thereof, of the one or more assist features.

According to an embodiment, the lithographic apparatus comprises projection optics comprising one or more reflective optical components.

According to an embodiment, the lithographic process uses extreme ultra-violet radiation for imaging the portion of the design layout onto the substrate.

According to an embodiment, the lithographic apparatus comprises non-telecentric optics.

According to an embodiment, computing the multi-variable cost function comprises simulating a resist image or an aerial image of the portion of the design layout.

According to an embodiment, simulating the resist image or the aerial image comprises using a source model, a projection optics model and a design layout model.

According to an embodiment, the portion of the design layout comprises one or more selected from: an entire design layout, a clip, a section of a design layout that is known to have a critical feature, and/or a section of the design layout where a critical feature has been identified by a pattern selection method.

According to an embodiment, the termination condition includes one or more selected from: minimization of the cost function; maximization of the cost function; reaching a preset number of iterations; reaching a value of the cost function equal to or beyond a preset threshold value; reaching a predefined computation time; and/or reaching a value of the cost function within an acceptable error limit.

According to an embodiment, iterative reconfiguration is performed with constraints dictating the range of at least some of the design variables.

According to an embodiment, at least some of the design variables are under a constraint representing a physical restriction in a hardware implementation of the lithographic apparatus.

According to an embodiment, the cost function is a function of one or more selected from: edge placement error, critical dimension, resist contour distance, worst defect size, and/or best focus shift.

According to an embodiment, the cost function is minimized by solving polynomials, including higher-order polynomials of the design variables.

According to an embodiment, at least some of the plurality of design variables are characteristics of an illumination source of the lithographic apparatus and the design layout.

According to an embodiment, the cost function is a function of a proximity effect.

Disclosed herein is a computer-implemented method to simulate imaging a portion of a design layout onto a substrate using a patterning device and a lithographic apparatus, the method comprising: reducing one or more pattern displacement errors, contrast loss, best focus shift, tilt of a Bossung curve of the portion, or a combination thereof, improving exposure latitude, or enlarging depth of focus, by adjusting one or more characteristics of a data structure representing an illumination source of the lithographic apparatus; calculating a continuous transmission map of the portion of the design layout; generating a data structure representing the patterning device, the data structure representing one or more assist features, wherein numbers, positions, shapes or a combination thereof, of the one or more assist features are identified from the continuous transmission map.

According to an embodiment, the method further comprises placing the one or more assist features onto the patterning device.

Disclosed herein is a computer-implemented method to improve a lithographic process for imaging a portion of a design layout onto a substrate using a lithographic apparatus, the method comprising: obtaining an adjustment to a phase distribution, an intensity distribution, or a combination thereof, of light diffracted from one or more main features of the portion; deriving one or more characteristics of one or more assist features based on the adjustment.

According to an embodiment, the method further comprises implementing the one or more assist features with the one or more characteristics.

According to an embodiment, the adjustment comprises an adjustment to amplitudes of diffraction orders of the diffracted light.

According to an embodiment, the adjustment comprises an adjustment to relative phases of diffraction orders of the diffracted light.

According to an embodiment, the adjustment is obtained from an optimization of the lithographic process.

According to an embodiment, the optimization is selected from a group consisting of SMO, SMPO, SMLO, an optimization to compensate for three-dimensional effect of a patterning device, an optimization to compensate for three-dimensional effect of the substrate, an optimization to compensate for heating effect, an optimization to enlarge an overlapping process window, an optimization for increasing a yield of the lithographic process, and a combination thereof.

According to an embodiment, the amplitude distribution, the phase distributions, parameterized characteristics of the intensity distribution, parameterized characteristics of the phase distributions, or a combination thereof are design variables in the optimization.

According to an embodiment, the adjustment is obtained from an empirical rule, obtained from metrology data, or obtained from a database.

According to an embodiment, the one or more characteristics comprise one or more optical characteristics of the one or more assist features, one or more geometrical characteristics of the one or more assist features, or a combination thereof.

According to an embodiment, the one or more optical characteristics comprise transmissivity or distribution of transmissivity of the one or more assist features.

According to an embodiment, the one or more geometrical characteristics comprise number, shape, or position of the one or more assist features.

Any of the steps of the methods in this disclosure may be implemented by a computer.

Disclosed herein is a computer program product comprising a non-transitory computer readable medium having instructions recorded thereon, the instructions when executed by a computer implementing the method in this disclosure.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIGS. 2A-2C schematically show light paths between a dipole illumination pupil and a projection pupil;

DETAILED DESCRIPTION

Figure 1A:
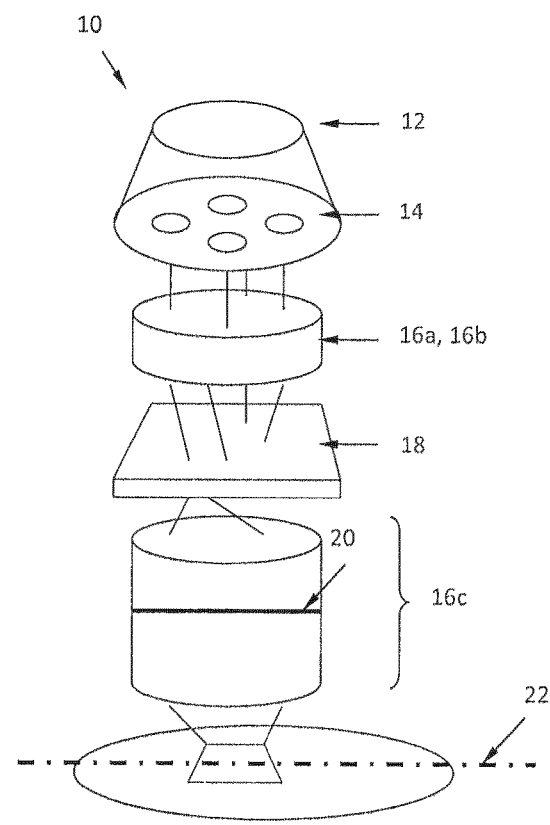
FIG. 1A is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic apparatuses that project a design layout onto a substrate using illumination from a deep-ultraviolet (e.g., 13.52 nm) illumination source or an extreme-ultraviolet illumination source, creating individual functional elements having dimensions well below 30 nm.

This process in which features with dimensions smaller than the classical resolution limit of a lithographic apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic apparatus, no matter where the optical component is located on an optical path of the lithographic apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a wafer under some or all conditions in the process window. Assist features can take on much more aggressive forms than simple hammerheads added to line ends, to the extent the pattern on the mask is no longer simply the desired wafer pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the wafer, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of SBAR adds yet another layer of complexity to a mask. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic apparatus, for example, parameters a user of the lithographic apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2x nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic apparatus such that results and/or processes of lithography have more desirable characteristics, such as higher accuracy of projection of design layouts on a substrate, larger process windows, etc.

Further, the lithographic apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic apparatuses are described, for example, in U.S. Pat. No. 5,969,441, incorporated herein by reference.

The patterning device referred to above comprise design layouts. The design layouts can be generated utilizing CAD (computer-aided design) programs, this process often being referred to as EDA (electronic design automation). Most CAD programs follow a set of design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1B:
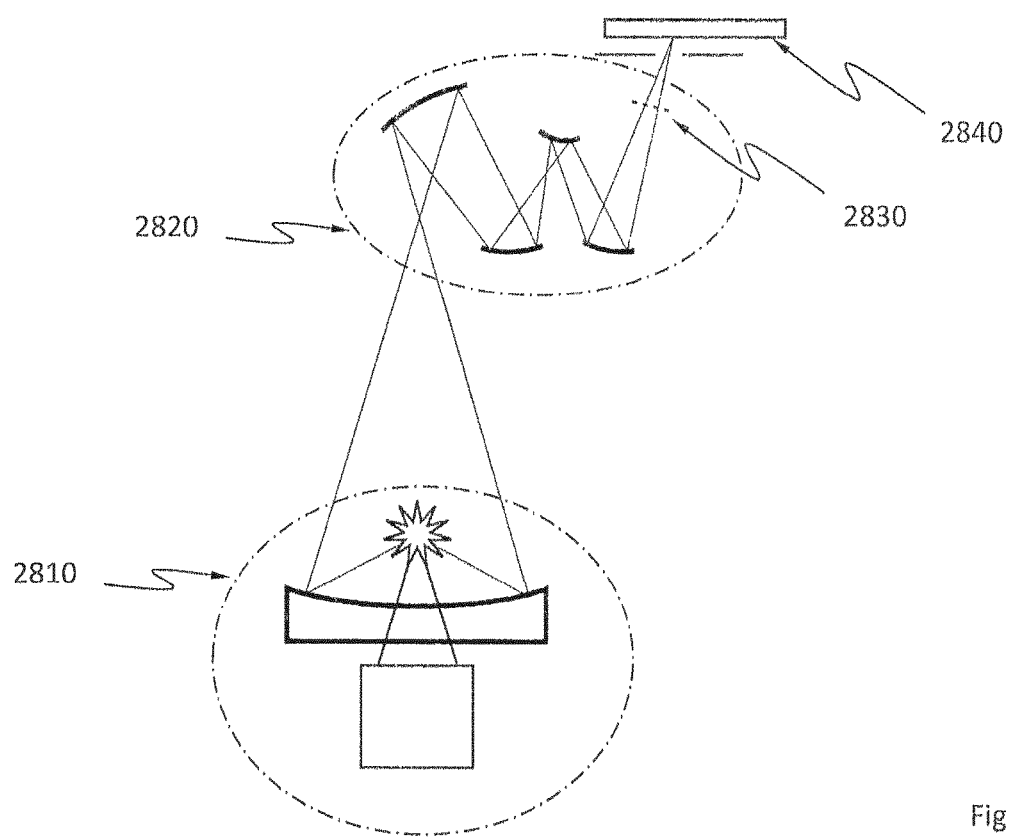
FIG. 1B shows a schematic of an illumination source.

As a brief introduction, FIG. 1A illustrates a lithographic apparatus. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics NA=n sin ($\Theta_{max}$), n is the index of Refraction of the media between the last element of project lens and the wafer. The term "source" and "illumination source" as used herein may include illumination optics. For example, FIG. 1B shows an EUV illumination source including a source collector module 2810 and illumination optics 2820. In the source collector module 2810, EUV radiation may be produced by a plasma. The EUV radiation is then shaped by the illumination optics 2820 and directed to a patterning device 2840. A pupil at a plane between the patterning device 2840 and the illumination optics 2820 may be referred to as an illumination pupil. The "shape" of the illumination source refers to the intensity and/or phase distribution at the illumination pupil.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic apparatus (e.g., properties of the source, the patterning device and the projection optics) dictate the aerial image. Since the patterning device used in the lithographic apparatus can be changed, it is desirable to separate the optical properties of the patterning device from the optical properties of the rest of the lithographic apparatus including at least the source and the projection optics.

Figure 14:
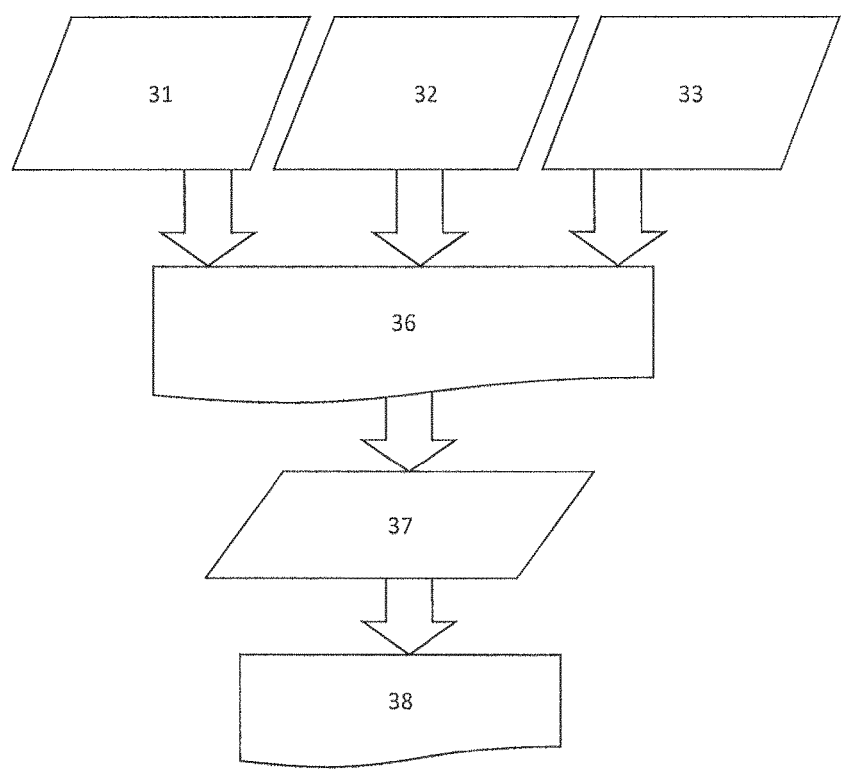
FIG. 14 is a block diagram of simulation models corresponding to the subsystems in FIG. 1A.

A flow chart for simulating lithography in a lithographic apparatus is illustrated in FIG. 14. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

Many physical effects may be adverse to the lithographic process. One such effect is pattern displacement error (PDE), also known as pattern shift error. This error is a measurement of the shift of a pattern from its intended location in a simulated or actual image (e.g., aerial image, resist image, and etched image). Sometimes, the pattern displacement error is pattern-independent, i.e., the error being the same for all the patterns on the patterning device. A pattern-independent pattern displacement error is relatively easy to compensate for or correct, for example, by shifting the patterning device or the substrate. Sometimes, the pattern displacement error is pattern-dependent, which makes its compensation or correction more difficult. The shift may be caused by a variety of reasons, such as non-uniform distortion of the patterning device due to heating or mechanical force. The reasons for the shift may also include configuration of the lithographic apparatus, such as finite heights of the patterns on a patterning device (i.e., 3-D effect), pattern-dependent incident or exit angles, non-uniform intensity of zero diffraction order from different positions of the illumination pupil, and distortion or non-telecentricity of the projection optics. The term "intensity" of a diffraction order and the term "amplitude" of a diffraction order are used interchangeably. In certain lithographic apparatuses, the patterning device is reflective instead of transmissive. A reflective patterning device may have absorbing materials on a surface that form the patterns to be transferred to a substrate. These absorbing materials may have a finite (non-negligible) height. The angle of incidence of radiation from the source at the reflective patterning device may be non-zero. The angle of incidence at a location on the patterning device may be different for radiation from different parts of the illumination pupil. The angle of incidence at different locations for radiation from the same part of the illumination pupil may be different. Another consequence of the reflective patterning device combined with non-zero angle of incidence is unbalance of intensity in diffraction orders from the source.

Another such effect is the best focus shift. The term "best focus shift" means that the best focus of one feature on the patterning layout may be different from the best focus of another feature.

As an example to demonstrate the contribution of a reflective patterning device and non-zero angle of incidence on the lithographic process, FIG. 2A schematically shows an example of dipole illumination pupil 2200 illuminating a reflective patterning device 2300. The dipole illumination pupil 2200 has two poles 2210 and 2220. The radiation from one pole 2210 is incident on the patterning device 2300 along path 2211, and diffracts along path 2212 at the zero order. The radiation from the other pole 2220 is incident on the patterning device 2300 along path 2221, and diffracts along path 2222 at the zero order. The incident angles of the radiation from the two poles are different at the same pattern 2310 on the patterning device 2300. FIG. 2B shows the shadow width 2311 of the pattern 2310 with respect to pole 2210. FIG. 2C shows the shadow width 2312 of the pattern 2310 with respect to pole 2220. The shadow width 2311 is greater than the shadow width 2312 because of the different angles of incidence for these poles. Within the shadow width, incident radiation is absorbed by the pattern 2310. As a result, at the projection pupil 2240, the zero order diffraction 2215 of pole 2210 has a lower intensity (depicted by the wiggly hatching) than the zero order diffraction 2225 of pole 2220. This difference of intensity between the zero order diffractions may lead to PDE. Difference of intensity between the first order diffractions may lead to contrast loss.

PDE, best focus shift and contrast loss may adversely affect the lithographic process by reducing the process window. The process window may be defined as a space of process window metrics (e.g., EL and DOF) in which the lithographic process is "in spec"—a varieties of criteria being satisfied (e.g., throughput, likelihood of defects, etc.). The reduction of the process window may be manifested in a tilted Bossung curve. A Bossung curve (also known as Bossung plot) shows dependence of the CD of a particular feature on focus under a constant dose. A tilted Bossung curve means that the curve is asymmetric with respect a value of focus.

Figure 3:
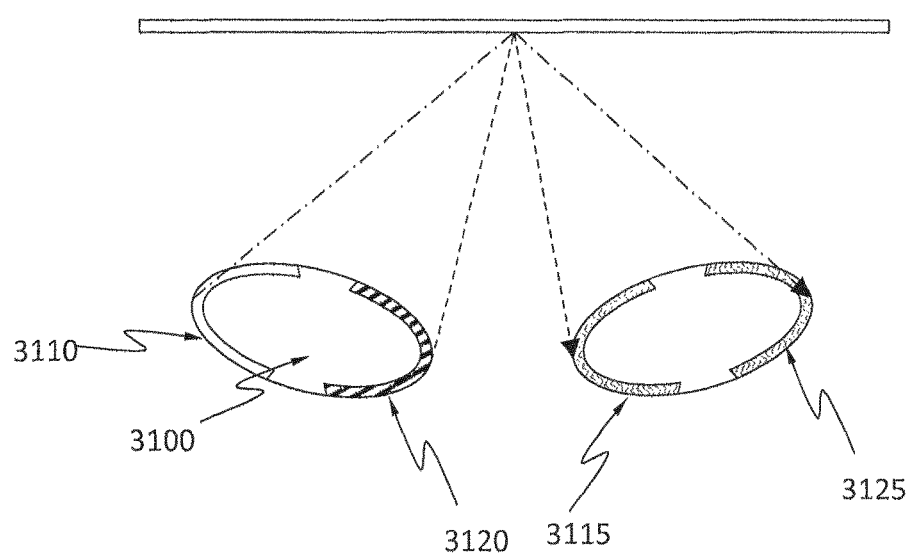
FIG. 3 schematically shows an example of a dipole illumination pupil with unbalanced poles.

The shape of the illumination source (i.e., the intensity and/or phase distribution of an illumination pupil) can be used to compensate for PDE, contrast loss and best focus shift and thereby enlarging the process window. FIG. 3 schematically shows an example of a dipole source 3100 with unbalanced poles 3110 and 3120, where the intensity of pole 3110 is greater than the intensity of pole 3120. This unbalance compensates for the difference of intensity between the zero order diffractions, i.e., causes the zero order diffractions to have the same intensity, and thus corrects PDE. This unbalance can also compensate for the contrast loss caused by the difference of intensity between the first order diffractions. The shape of the illumination source may be represented in any suitable data structures. For example, one such a data structure may include representations of intensities as a function of positions on the illumination pupil. Other examples may include representations of the configuration of a facetted field mirror device, a facetted pupil mirror device, or their combination, or in general representations of the configuration illumination optics. The data structures may also include the total intensity of the illumination pupil, phase as a function of positions on the illumination pupil, fill factor, etc. Adjustment or optimization of the source as disclosed herein may be conducted by adjusting or optimizing the data structures that represent the source.

Figure 4A:
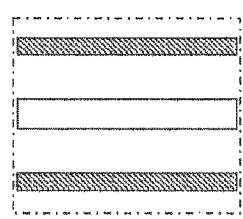
FIGS. 4A-4C demonstrate that the source affects PDE.
Figure 4B:
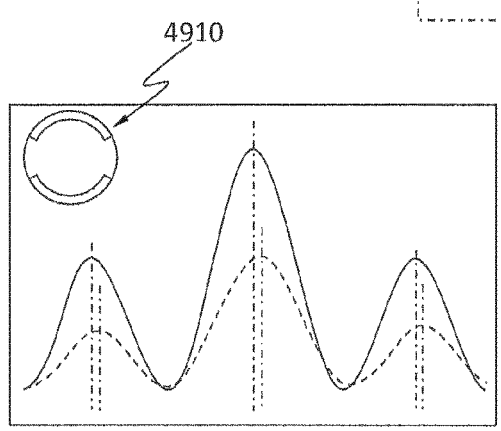
Figure 4C:
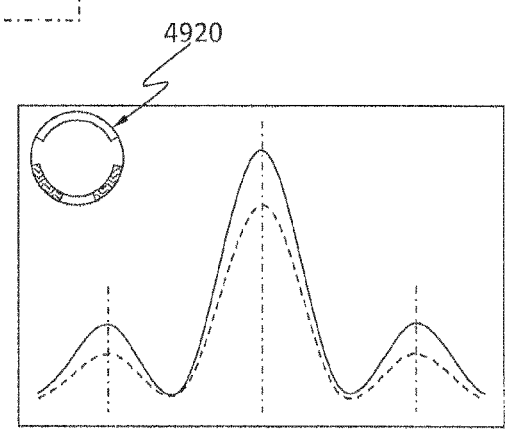

FIGS. 4A-4C demonstrate that the source affects PDE. As shown in FIG. 4A, a patterning device with a main feature and two symmetrical assist features on a reflective patterning device is used for this demonstration. FIG. 4B shows an aerial image (solid line) of the patterning device of FIG. 4A simulated using a symmetrical dipole source 4910 with the thickness of the absorbing material on the patterning device assumed to be zero, and an aerial image (dotted line) of the patterning device of FIG. 4A simulated with the electromagnetic effect of the non-zero thickness of the absorbing material taken into account. FIG. 4C shows an aerial image (solid line) of the patterning device of FIG. 4A simulated using an asymmetrical illumination pupil 4920 with the thickness of the absorbing material on the patterning device assumed to be zero, and an aerial image (dotted line) of the patterning device of FIG. 4A simulated with the electromagnetic effect of the non-zero thickness of the absorbing material taken into account. The area of the asymmetrical illumination pupil 4920 with wiggly hatch has a lower intensity than the unhatched areas. The asymmetrical illumination pupil 4920 makes the aerial images of the main feature independent from whether the thickness of the absorbing material on the patterning device is taken into account.

An example of a method to optimize the source to reduce PDE may be found in commonly assigned U.S. Patent Application Ser. No. 61/955,015, which is incorporated by reference in its entirety.

Figure 5A:
FIGS. 5A-5D show the effect of assist features on PDE, contrast loss, best focus shift and the process window, as manifested by tilted Bossung curves.
Figure 5B:
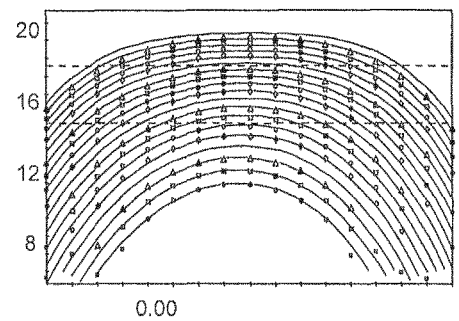
Figure 5C:
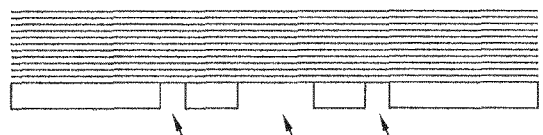
Figure 5D:
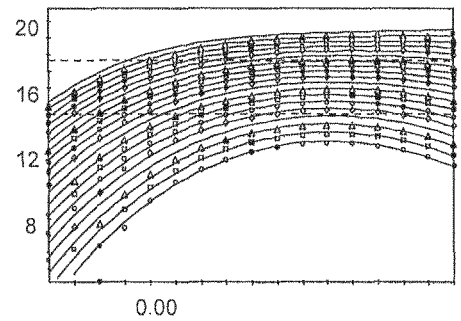

Assist features may reduce contrast loss but they may at the same time lead to higher PDE and best focus shift. According to an embodiment, adjusting positions, numbers and shapes of the assist features may retain the benefit (e.g., smaller contrast loss) and reduce their contribution to PDE and best focus shift. According to an embodiment, adjusting positions, numbers and shapes of the assist features may improve the exposure latitude or enlarge the depth of focus. FIGS. 5A, 5B, 5C and 5D show the effect of assist features as manifested by Bossung curves. Using a simulation with the electromagnetic effect of the non-zero thickness of the absorbing material taken into account ("rigorous simulation"), the Bossung curves for a main feature 4410 without any assist features as in FIG. 5A are obtained and essentially symmetric as shown in FIG. 5B, and the Bossung curves for the same main feature 4410 with assist features 4411 and 4412 as in FIG. 4C are obtained and are tilted as shown in FIG. 5D. This effect on Bossung curves by the assist features have been observed both theoretically and experimentally. Therefore, optimizing the source (as manifested in the illumination pupil), the assist features, or both can be a useful tool to reduce the adverse effect caused by having non-zero incident angles associated with reflective patterning devices, thereby enlarging the process window.

Figure 5E:
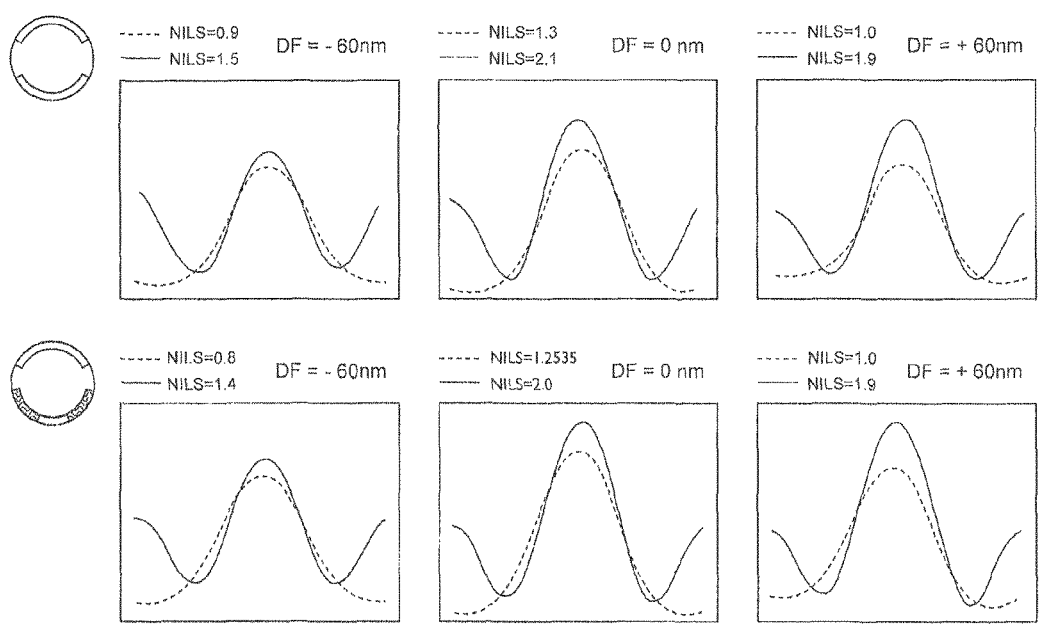
FIG. 5E shows the effect of assist features on reducing contrast loss.

FIG. 5E shows the effect of assist features on contrast loss. In each of the panels in FIG. 5E, the solid line is an aerial image of a main feature (64 nm pitch lines) with symmetrical assist features; the dotted line is an aerial image of the same main feature without any assist features. The upper three panels show aerial images under illumination of a symmetrical dipole illumination pupil. The lower three panels show aerial images under illumination of an asymmetrical dipole illumination pupil. The existence of assist feature increase the NILS values at multiple defocus values. Higher NILS values indicate lower contrast loss.

Assist features may be represented in any suitable data structures. One example is the GDSII format. In general, the data structure may include specification of the number, shape, and location of assist features. The shape and location may be represented as values relative to any main features or as absolute values with respect to the patterning device. Using relative values facilitates rule-based placement of assist features. The data structure representing assist features may be a separate data structure from a data structure representing the main features or may be part of a data structure representing the main features. Adjustment or optimization of the assist feature as disclosed herein may be conducted by adjusting or optimizing the data structures that represent the assist features.

Figure 6A:
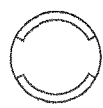
FIGS. 6A-6E illustrate that the root cause of the tilt of Bossung curves (which manifest PDE and best focus shift) includes the reflective patterning device and the non-zero angle of incidence of the radiation on the patterning device.
Figure 6B:
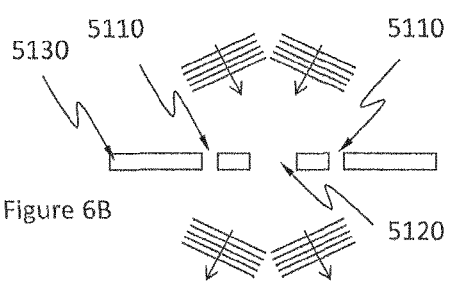
Figure 6D:
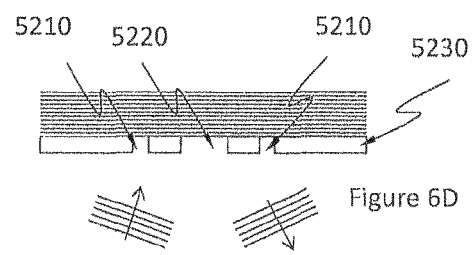
Figure 6C:
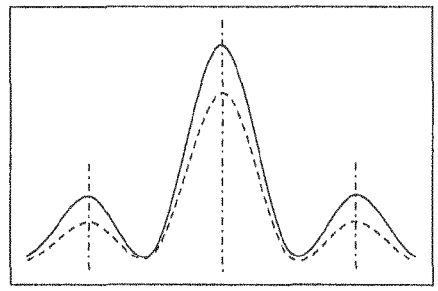
Figure 6E:
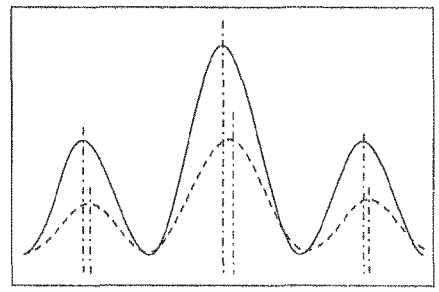

FIGS. 6A-6E illustrate that the root cause of the tilt of Bossung curves (which manifest PDE and best focus shift) includes the reflective patterning device and the non-zero angle of incidence of the radiation on the patterning device. FIG. 6A shows that the source used for the calculation in FIGS. 6B-6E is a symmetrical dipole source. FIG. 6B schematically shows a transmissive patterning device with a main feature 5120 and two symmetrically positioned assist features 5110. FIG. 6D schematically shows a reflective patterning device with a main feature 5220 and two symmetrically positioned assist features 5210. FIG. 6C shows an aerial image (solid line) of the patterning device of FIG. 6B simulated with the thickness of the absorbing material 5130 on the patterning device of FIG. 6B assumed to be zero, and an aerial image (dotted line) of the patterning device of FIG. 6B simulated with the electromagnetic effects of the non-zero thickness of the absorbing material 5130 taken into account. FIG. 6C shows that the position of the aerial image of the main feature 5110 remains the same regardless whether the electromagnetic effects of the non-zero thickness of the absorbing material 5130 is taken into account in the simulation, i.e., there is no PDE. In contrast, FIG. 6E shows an aerial image (solid line) of the patterning device of FIG. 6D simulated with the thickness of the absorbing material 5230 assumed to be zero, and an aerial image (dotted line) of the patterning device of FIG. 6D simulated with the thickness of the absorbing material 5230 taken into account. FIG. 6E shows that the position of the aerial image of the main feature 5220 depends on whether the electromagnetic effect of the non-zero thickness of the absorbing material 5230 is taken into account in the simulation.

Figure 7A:
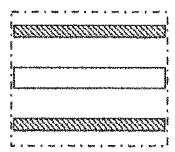
FIGS. 7A-7D show that assist features can affect the symmetry of the Bossung curves because assist features cause phase shift between zero diffraction order and higher diffraction orders.
Figure 7B:
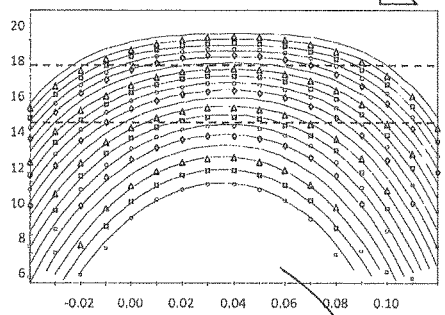
Figure 7C:
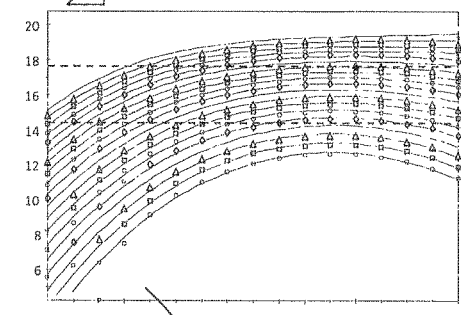
Figure 7D:
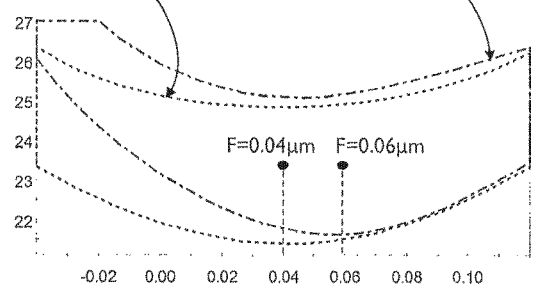

FIGS. 7A-7D show that assist features can affect the symmetry of the Bossung curves because assist features cause phase shift between zero order diffraction and higher order diffraction. Bossung curves in FIGS. 7B and 7C of a pattern shown in FIG. 7A with a main feature with two symmetric assist features are obtained by simulation with the thickness of the absorbing material on the patterning device assumed to be zero. The simulation for the Bossung curve in FIG. 7B is under the condition of no phase shift between the zero order diffraction and the higher order diffraction. The simulation for the Bossung curve in FIG. 7C is under the condition of a 30 degree phase shift between the zero order diffraction and the higher order diffraction (the 30 degree phase shift is artificially added to the simulation). The Bossung curves of FIG. 7C are very similar to those of FIG. 5D (Bossung curves simulated with the electromagnetic effect of the non-zero thickness of the absorbing material on the patterning device taken into account, under the condition of no phase shift between the zero order diffraction and the first order diffraction). This similarity suggests that the reason that assist features can affect the symmetry of the Bossung curves is that assist features cause phase shift between zero order diffraction and higher order diffraction. FIG. 7D shows that the best focus of the pattern of FIG. 7A depends on the tilt of the Bossung curves.

Figure 8:
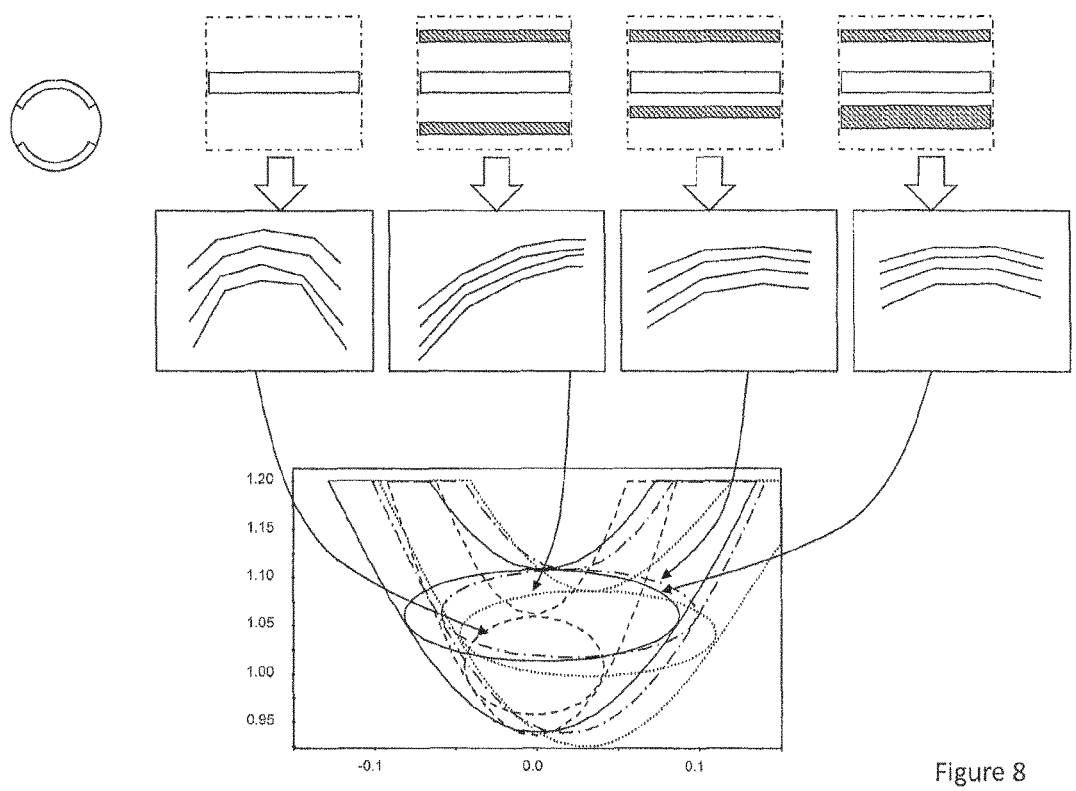
FIG. 8 shows that the shapes and positions of assist features affect the tilt of the Bossung curves.

FIG. 8 shows that the shapes and positions of assist features affect the tilt of the Bossung curves. Bossung curves of four patterns with an identical main feature and four different sets of assist features are simulated using a symmetrical dipole source. The four sets of assist features are, from left to right: no assist feature, two symmetrically positioned assist features with identical shape, two asymmetrically positioned assist features with identical shape, and two assist features that are both asymmetrically positioned and with different shapes. In this particular example, assist features that are both asymmetrically positioned and with different shapes result in the most symmetrical Bossung curves and a largest and symmetrically positioned process window.

Figure 9A:
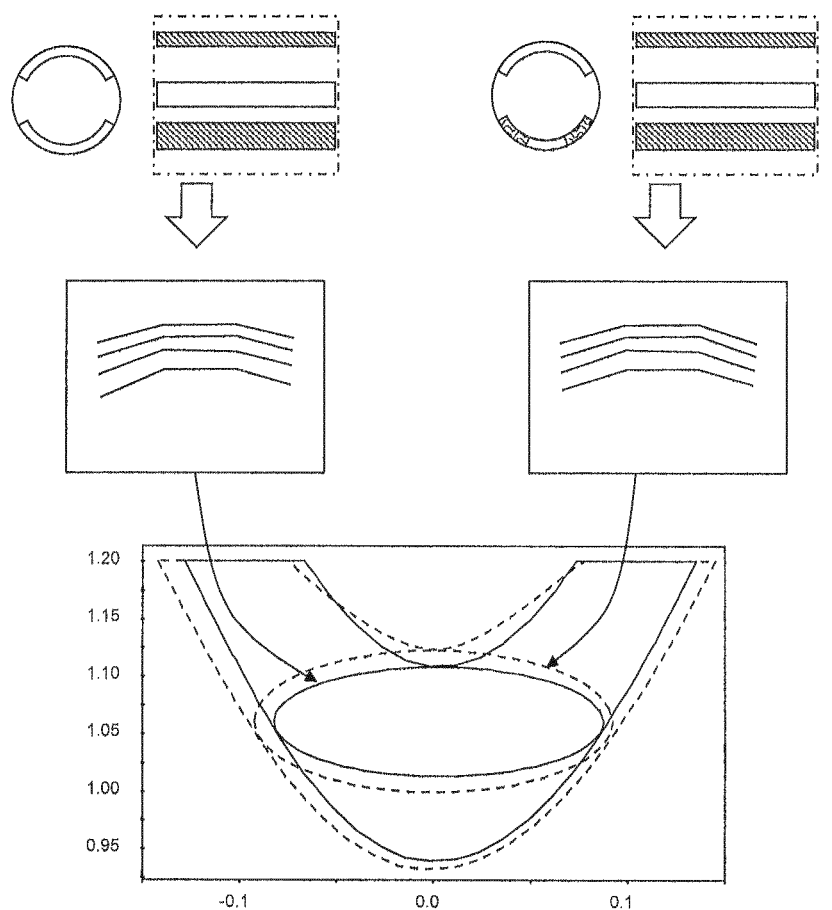
FIG. 9A shows a combined effect on the Bossung curves of asymmetrical assist features and asymmetrical illumination pupil.
Figure 9B:
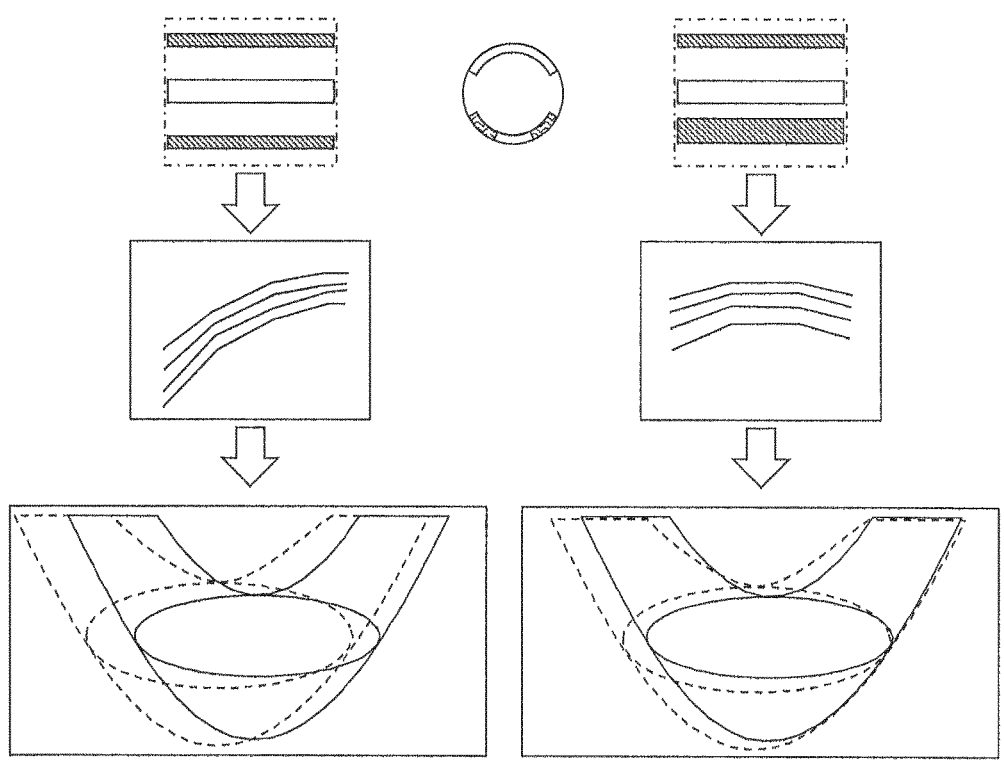
FIG. 9B shows the effect on the best focus shift of asymmetrical assist features.

FIG. 9A shows a combined effect on the Bossung curves of asymmetrical assist features and asymmetrical source. Bossung curves of a main feature with two assist features that are both asymmetrically positioned and with different shapes are simulated, respectively using a symmetrical source (left) and an asymmetrical source (right). The asymmetrical source results in a larger process window. FIG. 9B shows the effect on the best focus shift of asymmetrical assist features. The best focuses (i.e., centers of process windows) for two different patterns are simulated using an asymmetrical source and symmetrical assist features (left), and using an asymmetrical source and asymmetrical assist features (right). The asymmetrical assist features result in smaller best focus shift (i.e., more overlap of the process windows for the two different patterns).

Figure 10:
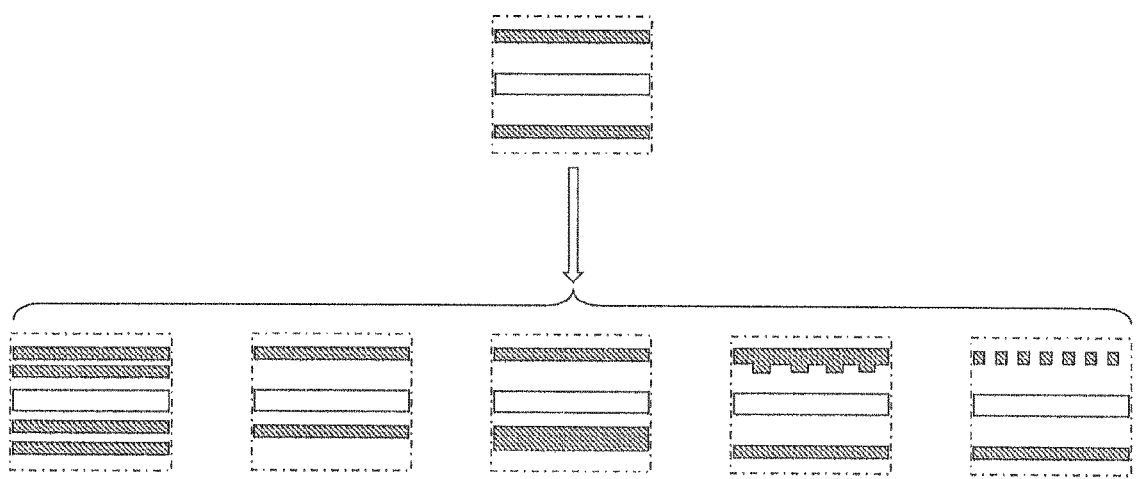
FIG. 10 shows several assist feature configurations that may be suitable for affecting tilt of the Bossung curves.

The shapes of assist features that may be used to affect tilt of the Bossung curves are not limited to bars with various widths. FIG. 10 shows several assist feature configurations with different positions, shapes and numbers that may be suitable. For example, the assist features are not necessarily a rectangle. They may have any complex shapes as needed. One particular example is the so-called halftone assist features, which are essentially a dotted line with a finite width (the rightmost example in FIG. 10). Also, in the previous examples and embodiments, only horizontal features and assist features are disclosed. However, it will be apparent to the skilled artisan that the considerations as disclosed in this text also hold for features and assist feature having a different orientation.

So far, the disclosure has shown that the source, shapes of assist features, positions of assist features, number of assist features, or a combination thereof, may be used to affect the tilt of Bossung curves, i.e., affect PDE, contrast loss, best focus shift and the process window. The source, shapes of assist features, and positions of assist features may be adjusted using a set of rules. They can also be optimized using any suitable optimization algorithm.

Figure 11A:
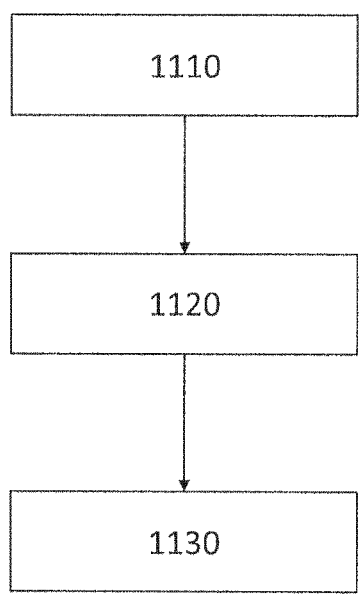
FIGS. 11A-13 each show a flow chart for a method of adjusting the source, shapes of assist features, and positions of assist features.

FIG. 11A shows a flow chart for a method of adjusting the source, shapes of assist features, number of assist features, and positions of assist features. In step 1110, the source is adjusted, thereby reducing pattern shift, contrast loss, and/or tilt of Bossung curves. Such methods are disclosed in commonly assigned U.S. Patent Application Ser. No. 61/955,015. In step 1120, a continuous transmission map (CTM) of a patterning device without any assist features is calculated using the source as adjusted in step 1110. The CTM of the patterning device without any assist features and the source may be adjusted or optimized simultaneously. In step 1130, identifying positions, numbers and shapes of assist features from the continuous transmission map (CTM) and placing the assist features onto the patterning device.

Figure 11B:
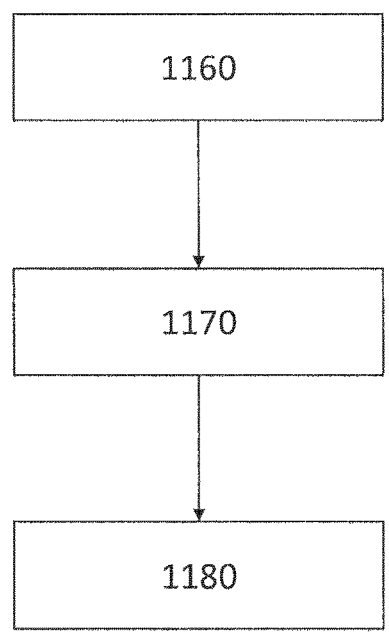

FIG. 11B shows a flow chart for a method of adjusting the source, shapes of assist features, number of assist features, and positions of assist features. In step 1160, the source is adjusted, thereby reducing pattern shift, contrast loss, and/or tilt of Bossung curves. In step 1170, one or more rules are obtained where the rules determine the shapes of assist features, the number of assist features, the positions of assist features, or a combination thereof for a main feature, based characteristics of the main feature. In step 1180, determining positions, numbers and shapes of assist features using the rules and placing the assist features onto the patterning device.

Figure 12:
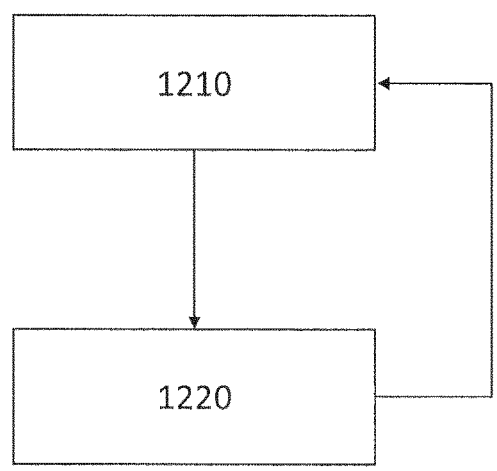

FIG. 12 shows another flow chart for a method of adjusting the source, shapes of assist features, number of assist features, and positions of assist features. In step 1210, the source is adjusted, thereby reducing pattern shift, contrast loss, and/or tilt of Bossung curves. Such methods are disclosed in commonly assigned U.S. Patent Application Ser. No. 61/955,015. In step 1220, the patterning device (e.g., assisting features thereon) is adjusted, thereby reducing pattern shift, contrast loss, best focus shift and/or tilt of Bossung curves, using the source as adjusted in step 1210. The steps 1210 and 1220 may be carried out iteratively.

Figure 13:
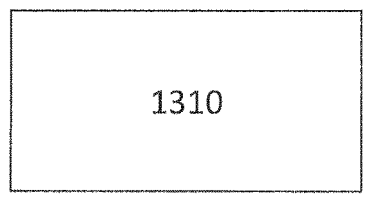

FIG. 13 shows another flow chart for a method of adjusting the source, shapes of assist features, number of assist features, and positions of assist features. In step 1310, the source, shapes of assist features, and positions of assist features are co-optimized.

Optimization can be performed using a cost function, such as $$CF(z_1, z_2, \ldots, z_N) = \sum_{p=1}^{P} w_p f_p^2(z_1, z_2, \ldots, z_N) \quad (\text{Eq. 1})$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a design layout (including points on assist features), or resist image, or aerial image.

The cost function may represent any suitable characteristics of the lithographic apparatus or the substrate, for instance, focus, CD, image shift, image distortion, image rotation, etc. For example, the cost function may be a function of one or more of the following lithographic metrics: edge placement error, critical dimension, resist contour distance, worst defect size, stochastic effect, three-dimensional effect of the patterning device, three-dimensional effect of the resist, best focus shift, pupil fill factor, exposure time, and throughput. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called a "wavefront manipulator" that can be used to adjust shapes of a wavefront and intensity distribution and/or phase shift of the irradiation beam. The projection optics can adjust a wavefront and intensity distribution at any location along an optical path of the lithographic apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic apparatus, and/or thermal expansion of components of the lithographic apparatus. Adjusting the wavefront and intensity distribution can change values of the evaluation points and the cost function. Such changes can be simulated from a model or actually measured.

It should be noted that the normal weighted root mean square (RMS) of $f_p(z_1, z_2, \ldots, z_N)$ is defined as $$\sqrt{\frac{1}{P} \sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $CF(z_1, z_2, \ldots, z_N) = \sum_{p=1}^{P} w_p f_p^2(z_1, z_2, \ldots, z_N)$, defined in Eq. 1. Thus the weighted RMS of $f_p(z_1, z_2, \ldots, z_N)$ and Eq. 1 may be utilized interchangeably for notational simplicity herein.

Further, if the PW (Process Window) is maximized, it is possible to consider the same physical location from different PW conditions as different evaluation points in the cost function in (Eq. 1). For example, if N PW conditions are considered, then the evaluation points can be categorized according to their PW conditions and the cost functions can be written as:

$$CF(z_1, z_2, \ldots, z_N) = \sum_{p=1}^{P} w_p f_p^2(z_1, z_2, \ldots, z_N)$$
$$= \sum_{u=1}^{U} \sum_{p_u=1}^{P_u} w_{p_u} f_{p_u}^2(z_1, z_2, \ldots, z_N) \quad (\text{Eq. 1'})$$

where $f_{p_u}(z_1, z_2, \ldots, z_N)$ is a function of the difference between an actual value and an intended value of the $p_t$-th evaluation point for a set of values of the design variables of $(z_1, z_2, \ldots, z_N)$ under the u-th PW condition $u=1, \ldots, U$. When this difference is the edge placement error (EPE), then minimizing the above cost function is equivalent to minimizing the edge shift under various PW conditions, thus this leads to maximizing the PW. In particular, if the PW also consists of different patterning device bias, then minimizing the above cost function also includes the minimization of MEEF (Mask Error Enhancement Factor), which is defined as the ratio between the wafer EPE and the induced mask edge bias.

The design variables or functions thereof may have constraints, which can be expressed as $(z_1, z_2, \ldots, z_N) \in Z$, where $Z$ is a set of possible values of the design variables. The constraints may represent physical restrictions in a hardware implementation of the lithographic apparatus. The constraints may include one or more of: tuning ranges, rules governing patterning device manufacturability, and interdependence between the design variables.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \arg\min_{(z_1, z_2, \ldots, z_N) \in Z} CF(z_1, z_2, \ldots, z_N) = \arg\min_{(z_1, z_2, \ldots, z_N) \in Z} \sum_{p=1}^{P} w_p f_p^2(z_1, z_2, \ldots, z_N) \quad \text{(Eq. 2)}$$

Figure 15:
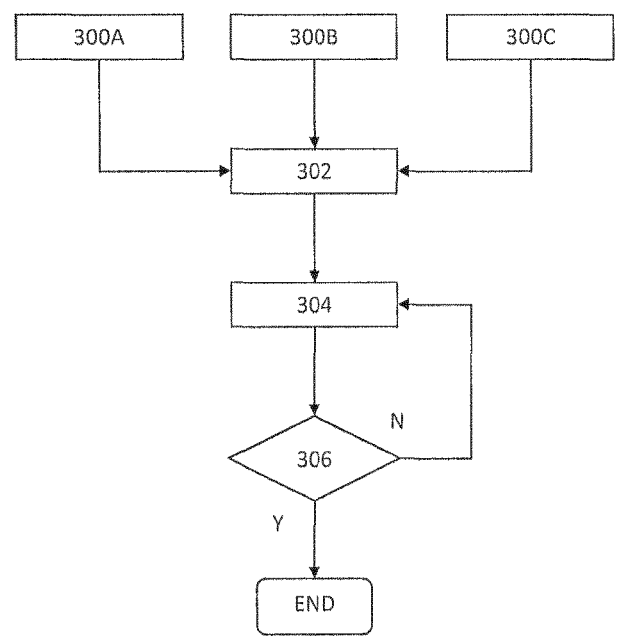
FIG. 15 shows a flow chart of a general method of optimizing the lithography projection apparatus.

A general method of optimizing the lithography projection apparatus, according to an embodiment, is illustrated in FIG. 15. This method comprises a step 302 of defining a multi-variable cost function of a plurality of design variables. The design variables may comprise any suitable combination selected from characteristics of the illumination pupil (300A) (e.g., pupil fill ratio, namely percentage of radiation of the source that passes through a pupil or aperture), characteristics of the projection optics (300B) and characteristics of the design layout (300C). For example, the design variables may include characteristics of the illumination source (300A) and characteristics of the design layout (300C) (e.g., global bias) but not characteristics of the projection optics (300B), which leads to an SMO. Alternatively, the design variables may include characteristics of the illumination source (300A), characteristics of the projection optics (300B) and characteristics of the design layout (300C), which leads to a source-mask-lens optimization (SMLO). In step 304, the design variables are simultaneously adjusted so that the cost function is moved towards convergence. In step 306, it is determined whether a termination condition is satisfied. The termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step 306 is satisfied, the method ends. If none of the conditions in step 306 is satisfied, the step 304 and 306 are iteratively repeated until a desired result is obtained. The optimization does not necessarily lead to a single set of values for the design variables because there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In another embodiment, instead of, or in addition to, calculating and/or determining the effect on the optical characteristics of the projection optics, it is envisioned that adjustable optical characteristics of the projection optics can be included in the design variables. Adjustable optical characteristics may include as lens manipulators, the temperature data or signal associated with the temperature data of one or more devices, e.g. heaters, utilized to control the temperature of an optical element of the projection system, Zernike coefficients. The SMO procedure can then be carried out and the design variables, including the adjustable optical characteristics, can be simultaneously adjusted so that the cost function is moved towards convergence.

Figure 16:
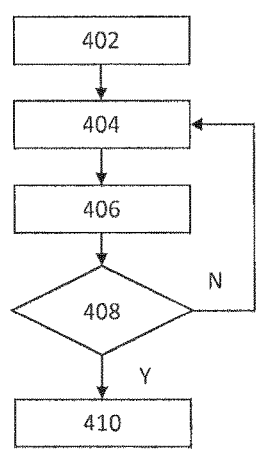
FIG. 16 shows a flow chart of a method of optimizing the lithography projection apparatus where the optimization of all the design variables is executed alternately.

In FIG. 3, the optimization of all the design variables is executed simultaneously. Such flow may be called the simultaneous optimization, joint optimization, or co-optimization. The terms "simultaneous", "simultaneously", "joint" and "jointly" as used herein mean that the design variables of the characteristics of the source, patterning device, projection optics and/or any other design variables, are allowed to change at the same time. Alternatively, the optimization of all the design variables is executed alternately, as illustrated in FIG. 16. In this flow, in each step, some design variables are fixed while the other design variables are optimized to minimize the cost function; then in the next step, a different set of variables are fixed while the others are optimized to minimize the cost function. These steps are executed alternately until convergence or certain terminating conditions are met. As shown in the non-limiting example flowchart of FIG. 16, first, a design layout (step 402) is obtained, then a step of source optimization is executed in step 404, where all the design variables of the illumination source are optimized (SO) to minimize the cost function while all the other design variables are fixed. Then in the next step 406, a mask optimization (MO) is performed, where all the design variables of the patterning device are optimized to minimize the cost function while all the other design variables are fixed. These two steps are executed alternately, until certain terminating conditions are met in step 408. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternate-Optimization is used as an example for the alternate flow. The alternate flow can take many different forms, such as SO-LO-MO-Alternate-Optimization, where SO, LO (Lens Optimization) is executed, and MO alternately and iteratively; or first SMO can be executed once, then execute LO and MO alternately and iteratively; or SMPO (source mask polarization optimization) and so on. Finally the output of the optimization result is obtained in step 410, and the process stops.

The pattern selection algorithm, as discussed before, may be integrated with the simultaneous or alternate optimization. For example, when an alternate optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 17:
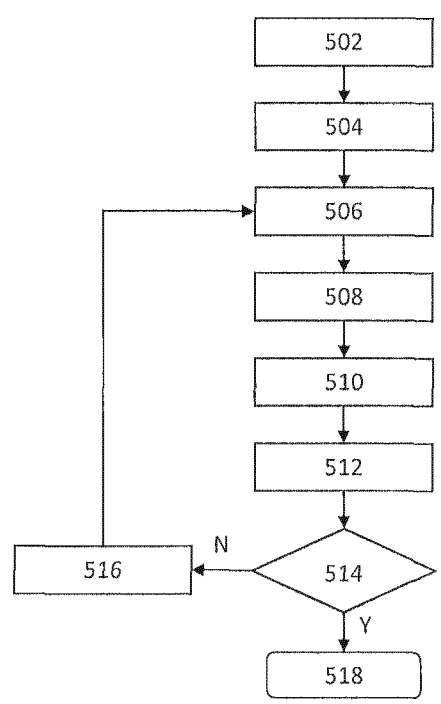
FIG. 17 shows one method of optimization, where a cost function is minimized.

FIG. 17 shows one method of optimization, where a cost function is minimized. In step 502, initial values of design variables are obtained, including their tuning ranges, if any. In step 504, the multi-variable cost function is set up. In step 506, the cost function is expanded within a small enough neighborhood around the starting point value of the design variables for the first iterative step (i=0). In step 508, standard multi-variable optimization techniques are applied to minimize the cost function. Note that the optimization can have constraints, such as tuning ranges, during the optimization process in 508 or at a later stage in the optimization process. Each iteration is done for the given test patterns (also known as "gauges") for the identified evaluation points that have been selected to optimize the lithographic process. In step 510, a lithographic response (e.g., certain characteristics of the aerial image, resist image, or certain characteristics of the lithographic process such as the process window) is predicted. In step 512, the result of step 510 is compared with a desired or ideal lithographic response value. If the termination condition is satisfied in step 514, i.e. the optimization generates a lithographic response value sufficiently close to the desired value, and then the final value of the design variables is outputted in step 518. The output step may also include outputting other functions using the final values of the design variables, such as outputting a wavefront aberration-adjusted map at the pupil plane (or other planes), an optimized source map, and optimized design layout etc. If the termination condition is not satisfied, then in step 516, the values of the design variables is updated with the result of the i-th iteration, and the process goes back to step 506. The process of FIG. 17 is elaborated in details below.

In an optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth $$\left(\text{e.g., first order derivatives } \frac{\partial f_p(z_1, z_2, \ldots, z_N)}{\partial z_n}, (n=1, 2, \ldots N) \text{ exist}\right),$$

which is generally valid in a lithographic apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$. does not reduce any further) or a preset number of iterations is reached.

Specifically, in the i-th iteration, in the vicinity of $(z_{1i}, z_{2i}, \ldots, z_{Ni})$, (Eq. 3)

$$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots z_N=z_{Ni}} (z_n = z_{ni})$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \quad \text{(Eq. 4)}$$

$$\sum_{p=1}^{P} w_p \left( \sum_{n=1}^{N} \frac{f_p(z_{1i}, z_{2i}, \ldots, z_{Ni}) + \partial f_p(z_1, z_2, \ldots, z_N)}{\partial z_n}\bigg|_{z_1=z_{1i}, z_2=z_{2i}, \ldots z_N=z_{Ni}} (z_n = z_{ni}) \right)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0, \text{ wherein } n = 1, 2, \ldots, N.$$

If the design variables $(z_1, z_2, \ldots, z_N)$ are under the constraints in the form of J inequalities (e.g. tuning ranges of $(z_1, z_2, \ldots, z_N)$) $\sum_{n=1}^{N} A_{nj} z_n \leq B_j$, for J=1, 2, ..., J.; and K equalities (e.g. interdependence between the design variables) $\sum_{n=1}^{N} = C_{nk} z_n \leq D_k$, for k=1, 2, ..., K. the optimization process becomes a classic quadratic programming problem, wherein $A_{nj}, B_j, C_{nk}, D_k$ are constants. Additional constraints can be imposed for each iteration. For example, a "damping factor" $\Delta_D$, can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin N.Y.: Vandenberghe. Cambridge University Press).

Instead of minimizing the RMS of $f_p (z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p (z_0, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} w_p \left( \frac{f_p(z_1, z_2, \ldots, z_N)}{CL_p} \right)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{LP} \leq f_p(z_1, z_2, \ldots, z_N) \leq E_{Up}$, wherein $E_{LP}$ and $E_{Up}$, are two constants specifying the minimum and maximum allowed deviation for the $f_p(z_1, z_2, \ldots, z_N)$. Plugging Eq. 3 in, these constraints are transformed to, for $p=1, \ldots P$, $$\sum_{n=1}^{N} \frac{\partial f_p(z_1, z_2, \ldots, z_N)}{\partial z_n}\bigg|_{z_1=z_{1i},z_2=z_{2i},\ldots z_N=z_{Ni}} z_n \leq \qquad \text{(Eq. 6')}$$
$$E_{Up} + \sum_{n=1}^{N} \frac{\partial f_p(z_1, z_2, \ldots, z_N)}{\partial z_n}\bigg|_{z_1=z_{1i},z_2=z_{2i},\ldots z_N=z_{Ni}} z_{ni} -$$
$$f_p(z_{1i}, z_{2i}, \ldots z_{Ni})$$

and $$-\sum_{n=1}^{N} \frac{\partial f_p(z_1, z_2, \ldots, z_N)}{\partial z_n}\bigg|_{z_1=z_{1i},z_2=z_{2i},\ldots z_N=z_{Ni}} z_n \leq \qquad \text{(Eq. 6'')}$$
$$-E_{Up} - \sum_{n=1}^{N} \frac{\partial f_p(z_1, z_2, \ldots, z_N)}{\partial z_n}\bigg|_{z_1=z_{1i},z_2=z_{2i},\ldots z_N=z_{Ni}} z_{ni} +$$
$$f_p(z_{1i}, z_{2i}, \ldots z_{Ni})$$

Since Eq. 3 is generally valid only in the vicinity of $(z_1, z_2, \ldots, z_N)$, in case the desired constraints $E_{LP} \leq f_p(z_1, z_2, \ldots, z_N) \leq E_{Up}$ cannot be achieved in such vicinity, which can be determined by any conflict among the inequalities, the constants $E_{LP}$ and $E_{Up}$ can be relaxed until the constraints are achievable. This optimization process minimizes the worst defect size in the vicinity of $(z_1, z_2, \ldots, z_N)$, i. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = (1-\lambda)\sum_{p=1}^{P} w_p f_p^2(z_1, z_2, \ldots, z_N) + \qquad \text{(Eq. 6''')}$$
$$\lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \varepsilon)$:

$$CF(z_1, z_2, \ldots, z_N, f_0, \varepsilon_0) = \max_{(f,\varepsilon)=(f_0 \pm \Delta f, \varepsilon_0 \pm \varepsilon)} \max_p |f_p(z_1, z_2, \ldots, z_N, f, \varepsilon)| \qquad \text{(Eq. 27).}$$

or $$CF(z_1, z_2, \ldots, z_N, f_0, \varepsilon_0) = \sum_{(f,\varepsilon)=(f_0 \pm \Delta f, \varepsilon_0 \pm \varepsilon)} \sum_p w_p f_p^2(z_1, z_2, \ldots, z_N, f, \varepsilon) \qquad \text{(Eq. 27')}$$

or $$CF(z_1, z_2, \ldots, z_N, f_0, \varepsilon_0) = (1-\lambda)\sum_{(f,\varepsilon)=(f_0 \pm \Delta f, \varepsilon_0 \pm \varepsilon)} \sum_p w_p f_p^2(z_1, z_2, \ldots, z_N, f, \varepsilon) + \lambda \max_{(f,\varepsilon)=(f_0 \pm \Delta f, \varepsilon_0 \pm \varepsilon)} \max_p |f_p(z_1, z_2, \ldots, z_N, f, \varepsilon)| \qquad \text{(Eq. 27'')}$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 27, 27', or 27". If the design variables are characteristics of the projection optics, such as the Zernike coefficients, then minimizing the cost functions of Eqs. 27, 27', or 27" leads to process window maximization based on projection optics optimization, i.e., LO. If the design variables are characteristics of the source and patterning device in addition to those of the projection optics, then minimizing the cost function of Eqs. 27, 27', or 27" leads to process window maximizing based on SMLO, as illustrated in FIG. 9. If the design variables are characteristics of the source and patterning device and, then minimizing the cost functions of Eqs. 27, 27', or 27" leads to process window maximization based on SMO.

Assist features may have another use. They can function as local optical components that affect diffraction of a main feature or a group of main features in close proximity. As FIGS. 7A-7D show, assist features can affect the symmetry of the Bossung curves by causing phase shift between zero order diffraction and higher order diffraction. Therefore, assist features provide an opportunity to locally adjust diffraction of a main feature. Diffraction of the main feature may be manifested by amplitudes and phase distributions of light diffracted by the main feature. Assist features thus allow adjustment to these distributions. For example, when the diffracted light has distinct diffraction orders, assist features allow control of relative phase difference among the diffraction orders, relative phase difference between a diffraction order of the main feature and a diffraction order of another main feature; assist features also allow control of amplitudes of the diffraction orders. This capability of the assist features is especially useful in lithography using EUV because the short wavelengths of EUV lead to challenges for local adjustment of the wavefront both downstream and upstream of the patterning device. Using assist features as part of the optical system in a lithography apparatus may enhance or allow the capability of altering the wavefront.

Figure 22:
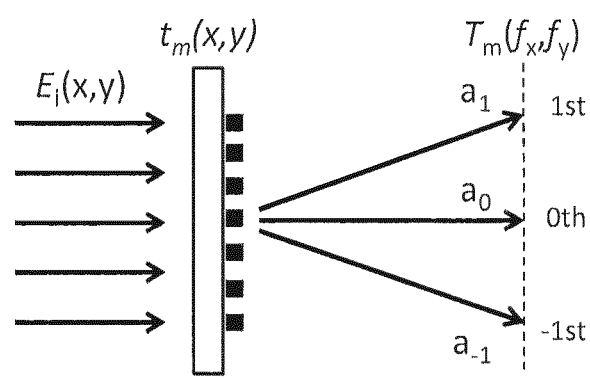
FIG. 22 shows a general schematic of diffraction by an object (e.g., a patterning device).

FIG. 22 shows a general schematic of diffraction by an object (e.g., a patterning device). Incident light may be represented by its electric field $E_i(x,y)$, as a function of position. The object may be represented as a transmission function $t_m(x,y)$. For example, when the object is a binary photomask, the transmission function $t_m(x,y)$ has a value of a positive constant where the binary photomask is not covered by an opaque material (e.g., Cr or absorber (EUV)), and a value of substantially zero where the binary photomask is covered by an opaque material. Diffracted light by the object may be represented by the electric field $T_m(f_x, f_y)$ of the diffracted light. The diffracted light may have distinct diffraction orders such as the $1^{st}$ order, the 0-th order and the $-1^{st}$ order. The relationship between $E_i(x,y)$, $t_m(x,y)$ and $T_m(f_x, f_y)$ may be mathematically represented as $T_m = \mathcal{F}\{E_i \cdot t_m\}$.

Figure 23A:
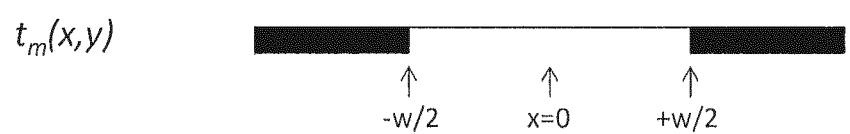
FIG. 23A shows an exemplary pattern including a main feature.

FIG. 23A shows an exemplary pattern including a main feature, whose transmission function is $$t_m(x, y) = \begin{cases} 1, & x \in \left[-\frac{w}{2}, \frac{w}{2}\right] \\ 0, & x \notin \left[-\frac{w}{2}, \frac{w}{2}\right] \end{cases}.$$

Figure 23B:
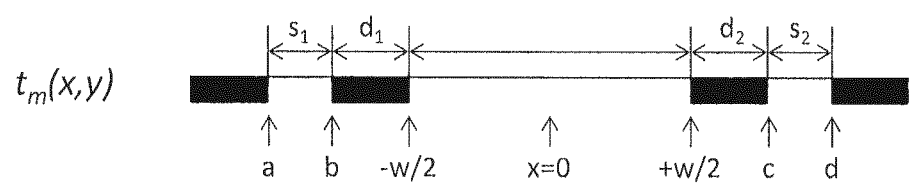
FIG. 23B shows another exemplary pattern including the same main feature in FIG. 23A with two assist features.

FIG. 23B shows another exemplary pattern including the same main feature in FIG. 23A with two assist features; the combined transmission function of the main feature and the assist features is $$t_m(x, y) = \begin{cases} 1, & x \in \left[-\frac{w}{2}, \frac{w}{2}\right] \cup [a, b] \cup [c, d] \\ 0, & x \notin \left[-\frac{w}{2}, \frac{w}{2}\right] \cup [a, b] \cup [c, d] \end{cases}.$$

These patterns will be used to demonstrate the effect of the assist features on diffraction (e.g., as manifested by intensity and phase distributions of diffracted light). For simplicity, the incident light is assumed to be a monochromatic, perfectly collimated light with uniform spatial distribution of intensity.

Under this assumption, the electric field of the diffracted light by an isolated main feature alone (FIG. 23A) is $$T_m(f_x) = \frac{\sin(\pi w f_x)}{\pi f_x}.$$

Under this assumption, the electric field of the diffracted light by the main feature and the two assist features (FIG. 23B) is $$T_m(f_x) = \frac{\sin(\pi w f_x)}{\pi f_x} + \frac{i}{2\pi f_x}(e^{-i2\pi f_x b} - e^{-i2\pi f_x a}) + \frac{i}{2\pi f_x}(e^{-i2\pi f_x d} - e^{-i2\pi f_x c}),$$

where the last two terms are the contribution by the assist features. These terms can have both a real part and an imaginary part, which means that the assist features may affect both the phase and intensity distributions of the diffracted light. In an alternative form, the electric field of the diffracted light may be expressed as $$T_m(f_x) = \frac{\sin(\pi w f_x)}{\pi f_x} + \frac{1}{\pi f_x}(\cos(\pi f_x \Delta d_1)\sin(\pi f_x s_1) + \cos(\pi f_x \Delta d_2)\sin(\pi f_x s_2) -$$

$$i(\sin(\pi f_x \Delta d_1)\sin(\pi f_x s_1) + \sin(\pi f_x \Delta d_2)\sin(\pi f_x s_2))),$$

where $s_1 = b - a; \Delta d_1 = b + a = -w - 2d_1 - s_1$ and $s_2 = d - c; \Delta d_2 = d + c = w + 2d_2 + s_2$.

The real part and the imaginary par may be changed simply by changing the geometrical and/or optical characteristics of the assist features (such as shapes, positions, transmission, and width ($s_1$, $s_2$) etc.). Conversely, when a desired adjustment to the diffraction is obtained (e.g., for any suitable purpose such as reducing distortion, enlarging the process window, improving the yield, etc.), geometrical and/or optical characteristics of the assist features may be derived in order to realize the desired adjustment.

Figure 24A:
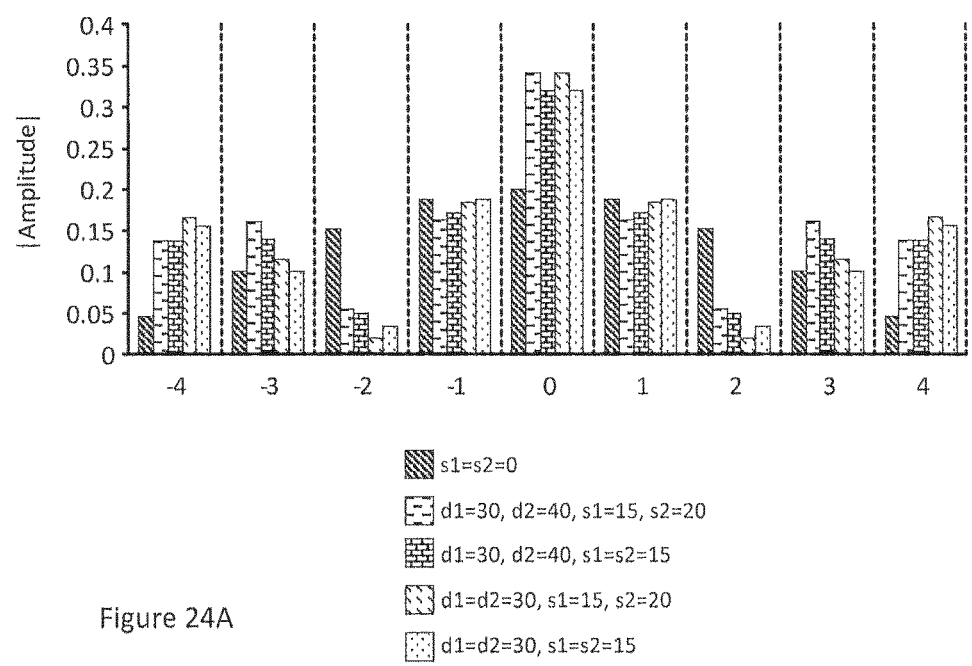
FIG. 24A shows the effect of the assist features on the amplitudes of the diffraction orders of the main feature, using the exemplary patterns in FIG. 23A and FIG. 23B as an example.

FIG. 24A shows the effect of the assist features on the amplitudes (i.e., intensities) of the diffraction orders of the main feature, using the exemplary patterns in FIG. 23A and FIG. 23B as an example. The horizontal axis is the diffraction orders and the vertical axis is the amplitudes of the diffraction orders. The five different hatches represent five configurations of the assist features. The configuration where $s_1 = s_2 = 0$ is the pattern in FIG. 23A, namely no assist features. FIG. 24A plainly shows that the assist features may be used to affect the intensity distribution of diffracted light.

Figure 24B:
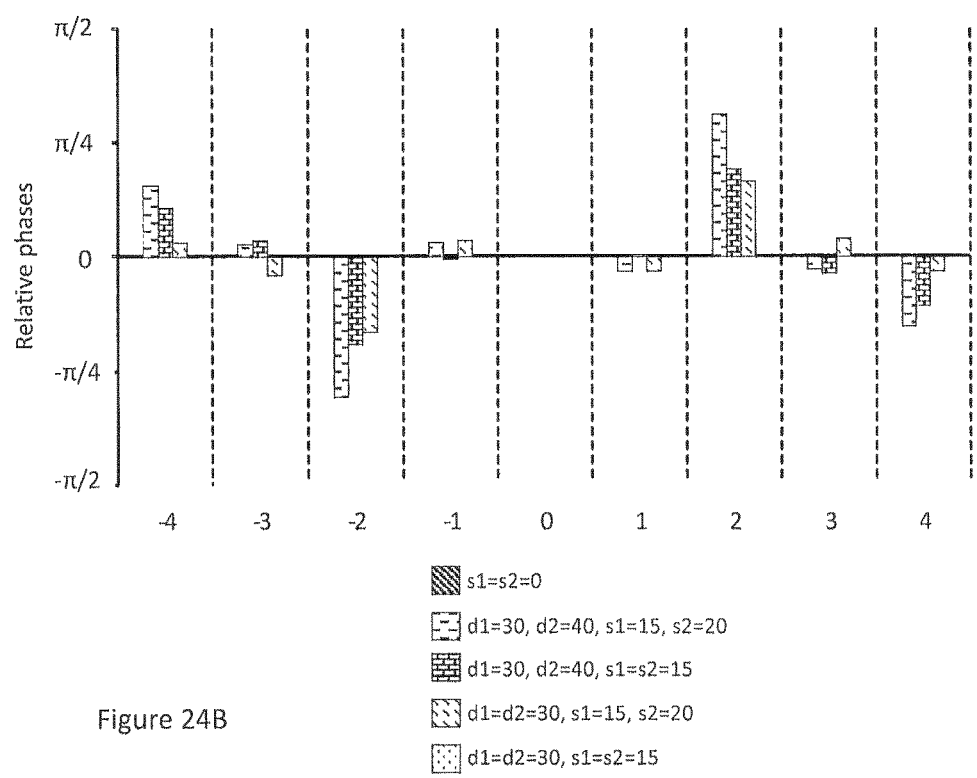
FIG. 24B shows the effect of the assist features on the relative phases of the diffraction orders of the main feature, using the exemplary patterns in FIG. 23A and FIG. 23B as an example.

FIG. 24B shows the effect of the assist features on the relative phases of the diffraction orders of the main feature, using the exemplary patterns in FIG. 23A and FIG. 23B as an example. The horizontal axis is the diffraction orders and the vertical axis is the relative phase with respect to the 0-th order in each configuration. The five different hatches represent five configurations of the assist features (same as in FIG. 24A). The configuration where $s_1 = s_2 = 0$ is the pattern in FIG. 23A, namely no assist features. FIG. 24B plainly shows that the assist features may be used to affect the phase distribution of diffracted light.

Figure 25A:
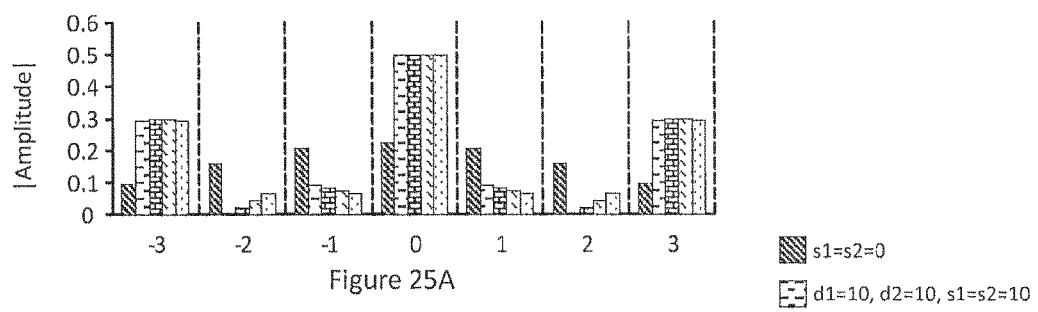
FIG. 25A and FIG. 25B specifically show how the distances ($d_1$, $d_2$) between the assist features to the main feature affect the intensities and the relative phases, using the exemplary patterns in FIG. 23A and FIG. 23B as an example.
Figure 25B:
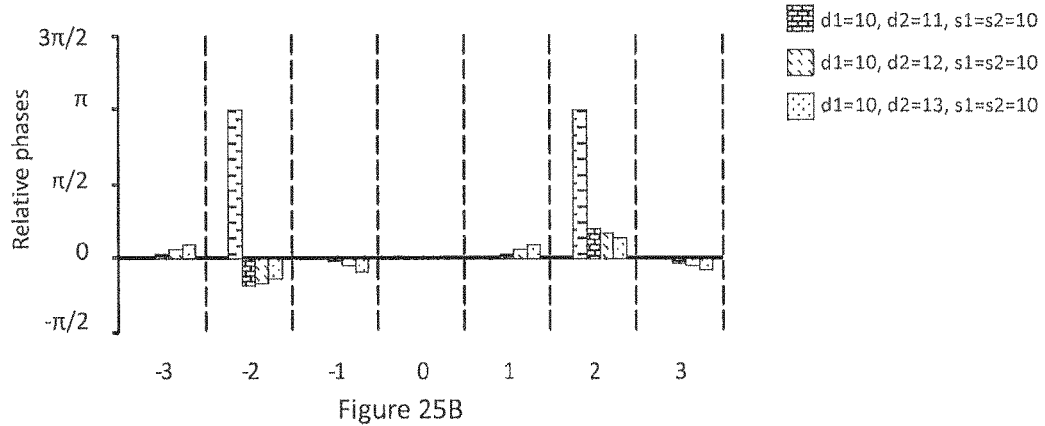

FIG. 25A and FIG. 25B specifically show how the distances between the assist features to the main feature affect the intensities and the relative phases, using the exemplary patterns in FIG. 23A and FIG. 23B as an example. The five different hatches represent five configurations of the assist features. The configuration where $s_1=s_2=0$ is the pattern in FIG. 23A, namely no assist features. Among these five configurations, the widths of the two assist features in FIG. 23B are kept constant while the distances to the main feature are varied.

Figures 26A, 26B:
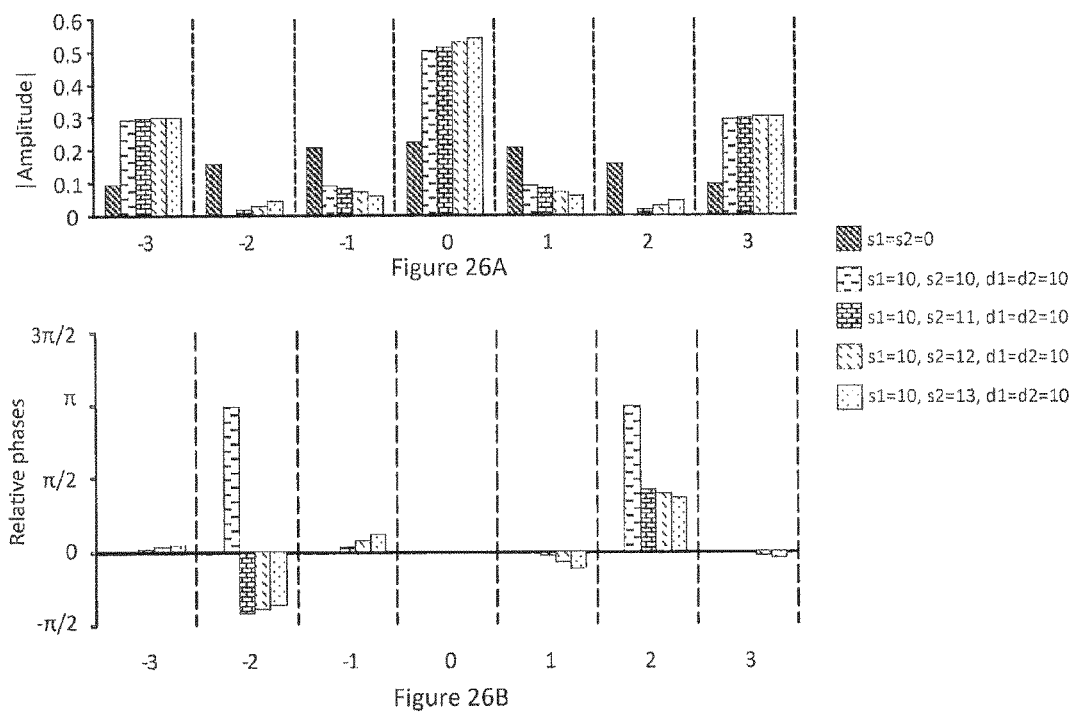
FIG. 26A and FIG. 26B specifically show how the widths of the assist features affect the intensities and the relative phases, using the exemplary patterns in FIG. 23A and FIG. 23B as an example.

FIG. 26A and FIG. 26B specifically show how the widths of the assist features affect the intensities and the relative phases, using the exemplary patterns in FIG. 23A and FIG. 23B as an example. The five different hatches represent five configurations of the assist features. The configuration where $s_1=s_2=0$ the pattern in FIG. 23A, namely no assist features. Among these five configurations, the distances of the two assist features to the main feature in FIG. 23B are kept constant while the widths of the assist features are varied.

Figure 27:
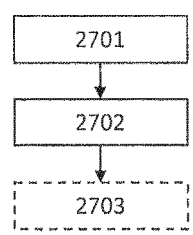
FIG. 27 shows a flow chart for a method according to an embodiment.

FIG. 27 shows a flow chart for a method according to an embodiment. In 2701, an adjustment to phase distribution and/or intensity distribution of light diffracted from a main feature (or a plurality of main features) is obtained. The adjustment may include an adjustment to the intensities of diffraction orders. The adjustment may include an adjustment to the relative phases of diffraction orders. The adjustment may be obtained by any suitable method. For example, the adjustment may be obtained from an optimization such as SMO, SMLO, SMPO (source mask polarization optimization), MO (mask only optimization), an optimization to compensate for three-dimensional effect of the patterning device, an optimization to compensate for three-dimensional effect of the substrate, an optimization to compensate for heating effect, an optimization to enlarge the overlapping process window, an optimization for increasing the yield. For example, the intensity and phase distributions or their parameterized characteristics may be used as design variables in these optimizations. For example, the adjustment may also be obtained from one or more empirical rules, obtained from metrology data, or obtained from a database.

In 2702, characteristics of one or more assist features are derived based on the adjustment. The characteristics may include optical characteristics, such as transmissivity, distribution of transmissivity. The characteristics may include geometrical characteristics, such as number, shape, and position. The assist features are not limited to straight lines but may have any suitable shape. A plurality of main features may share assist features.

In optional 2703, the one or more assist features with the derived characteristics may be implemented in the design layout so as to implement the desired adjustment.

Figure 18:
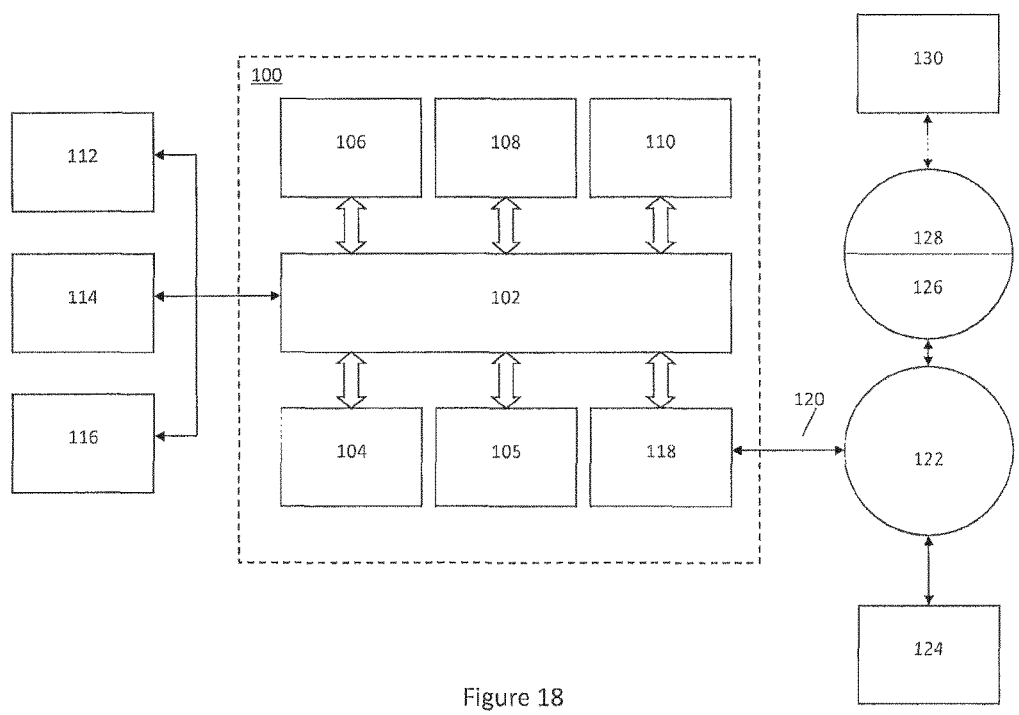
FIG. 18 is a block diagram of an example computer system in which embodiments can be implemented.

FIG. 18 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 19:
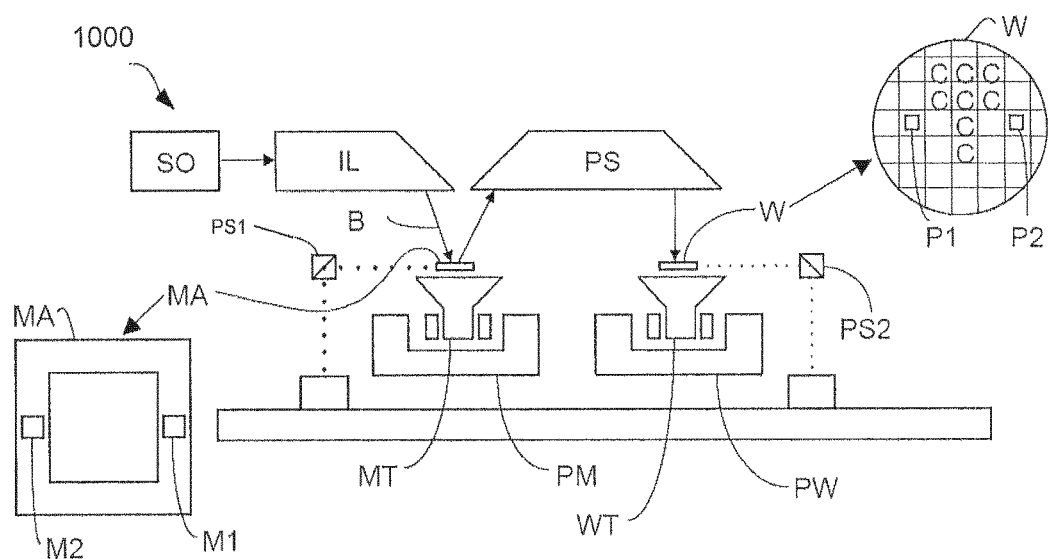
FIG. 19 is a schematic diagram of another lithographic apparatus.

FIG. 19 schematically depicts another lithographic apparatus 1000 whose illumination source could be optimized utilizing the methods described herein.

The lithographic apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 19, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 19, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 20:
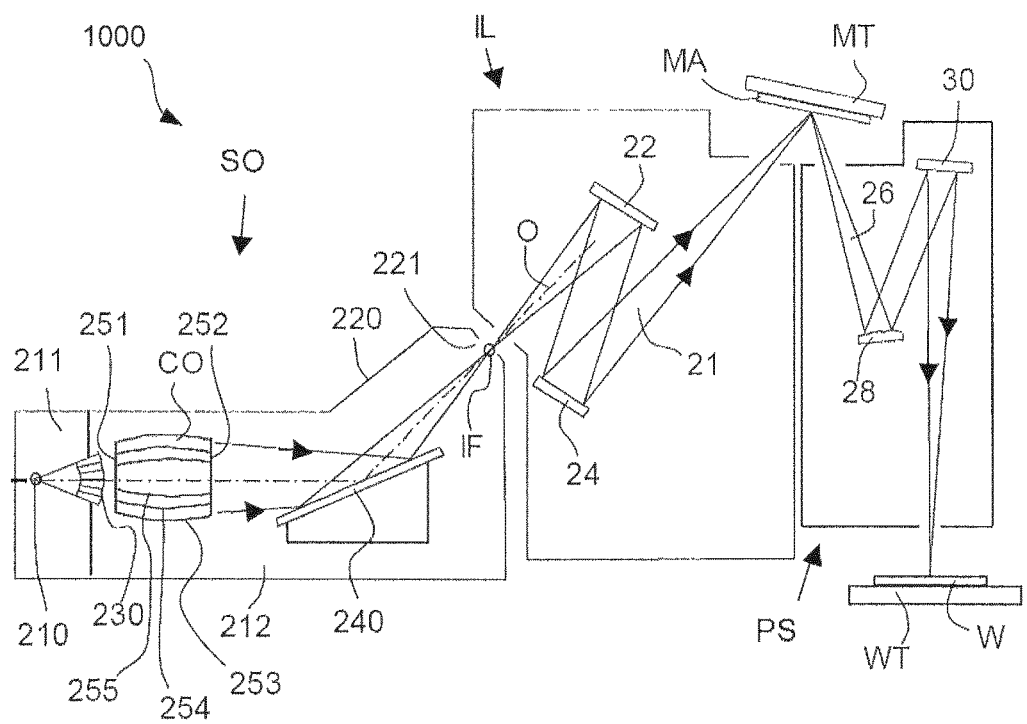
FIG. 20 is a more detailed view of the apparatus in FIG. 19.

FIG. 20 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 20.

Collector optic CO, as illustrated in FIG. 20, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 21:
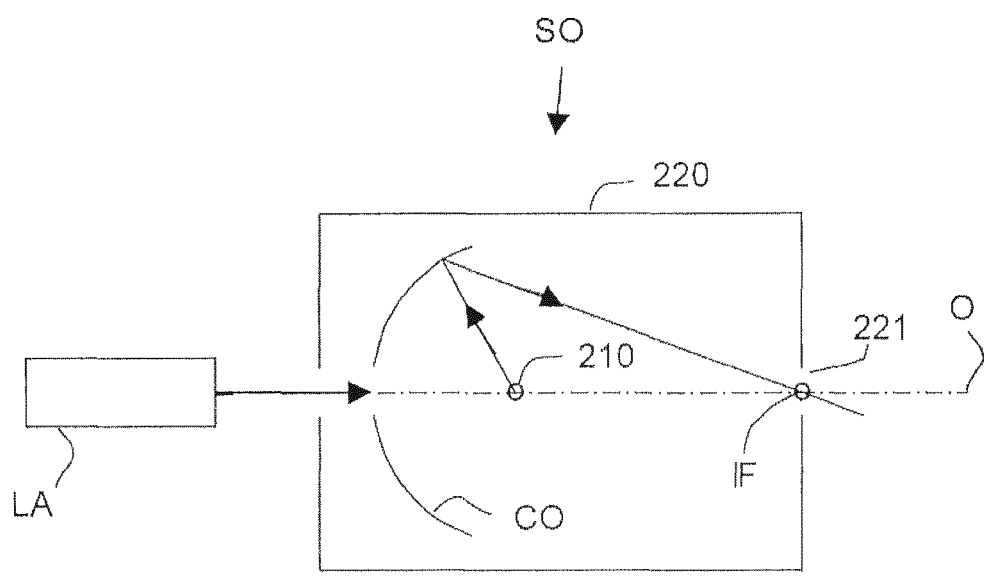
FIG. 21 is a more detailed view of the source collector module SO of the apparatus of FIG. 19 and FIG. 20.

Alternatively, the source collector module SO may be part of an LPP radiation system as shown in FIG. 21. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method to improve a lithographic process for imaging a portion of a design layout onto a substrate using a lithographic apparatus, the method comprising:

reducing one or more pattern displacement errors, contrast loss, best focus shift, tilt of a Bossung curve of the portion, or a combination thereof, improving exposure latitude, or enlarging depth of focus, by adjusting one or more characteristics of an illumination source of the lithographic apparatus;

calculating a continuous transmission map of the portion;

identifying numbers, positions and shapes of one or more assist features from the continuous transmission map;

placing the one or more assist features onto the patterning device.

2. A computer-implemented method to improve a lithographic process for imaging a portion of a design or test structure layout onto a substrate using a lithographic apparatus, the method comprising:

reducing one or more pattern displacement errors, contrast loss, best focus shift, tilt of a Bossung curve of the portion, or a combination thereof, improving exposure latitude, or enlarging depth of focus, by adjusting one or more characteristics of an illumination source of the lithographic apparatus;

obtaining one or more rules that determine one or more characteristics of one or more assist features based on one or more characteristics of a main feature in the portion;

determining numbers, positions and shapes the one or more assist features using the one or more rules;

placing the one or more assist features onto the patterning device.

3. A computer-implemented method to improve a lithographic process for imaging a portion of a design layout onto a substrate using a lithographic apparatus, the method comprising:

reducing one or more pattern displacement errors, contrast loss, best focus shift, tilt of a Bossung curve of the portion, or a combination thereof, improving exposure latitude, or enlarging depth of focus, by adjusting one or more characteristics of an illumination source of the lithographic apparatus;

reducing one or more pattern displacement errors, contrast loss, tilt of a Bossung curve of the portion, or a combination thereof, by adjusting one or more characteristics of the portion.

4. A computer-implemented method to improve a lithographic process for imaging a portion of a design layout onto a substrate using a lithographic apparatus, the method comprising:

computing a multi-variable cost function of a plurality of design variables that are characteristics of the lithographic process, wherein the multi-variable cost function is a function of one or more pattern displacement errors, contrast loss, best focus shift, tilt of a Bossung curve of the portion, exposure latitude, depth of focus, or a combination thereof; and reconfiguring the characteristics of the lithographic process by adjusting the design variables until a termination condition is satisfied.

5. A computer-implemented method to improve a lithographic process for imaging a portion of a design layout onto a substrate using a lithographic apparatus, the method comprising:

computing a multi-variable cost function of a plurality of design variables that are characteristics of the lithographic process; and reconfiguring the characteristics of the lithographic process by adjusting the design variables until a predefined termination condition is satisfied, under one or more constraints on one or more pattern displacement errors, contrast loss, best focus shift, tilt of a Bossung curve of the portion, or a combination thereof.

6. The method of any one of clauses 1 to 5, wherein the one or more pattern displacement errors are pattern-dependent.

7. The method of any of clauses 4 to 5, wherein the multi-variable cost function is an explicit function of the one or more pattern displacement errors, contrast loss, best focus shift, tilt of a Bossung curve of the portion, or a combination thereof.

8. The method of any of clauses 1 to 3, wherein adjusting one or more characteristics of an illumination source changes a symmetry of the illumination source.

9. The method of clause 3, wherein the portion comprises one or more assist features, and wherein adjusting the one or more characteristics of the portion comprises adjusting shapes, numbers, positions, or a combination thereof, of the one or more assist features.

10. The method of any of clauses 1 to 9, wherein the lithographic apparatus comprises projection optics comprising one or more reflective optical components.

11. The method of any of clauses 1 to 10, wherein the lithographic process uses extreme ultra-violet radiation for imaging the portion of the design layout onto the substrate.

12. The method of any of clauses 1 to 11, wherein the lithographic apparatus comprises non-telecentric optics.

13. The method of any of clauses 4 to 5, wherein computing the multi-variable cost function comprises simulating a resist image or an aerial image of the portion of the design layout.

14. The method of clause 13, wherein simulating the resist image or the aerial image comprises using a source model, a projection optics model and a design layout model.

15. The method of any of clauses 4 to 5, wherein the portion of the design layout comprises one or more selected from: an entire design layout, a clip, a section of a design layout that is known to have a critical feature, and/or a section of the design layout where a critical feature has been identified by a pattern selection method.

16. The method of any of clauses 4 to 5, wherein the termination condition includes one or more selected from: minimization of the cost function; maximization of the cost function; reaching a preset number of iterations; reaching a value of the cost function equal to or beyond a preset threshold value; reaching a predefined computation time; and/or reaching a value of the cost function within an acceptable error limit.

17. The method of any of clauses 4 to 5, wherein iterative reconfiguration is performed with constraints dictating the range of at least some of the design variables.

18. The method of any of clauses 4 to 5, wherein at least some of the design variables are under a constraint representing a physical restriction in a hardware implementation of the lithographic apparatus.

19. The method of any of clauses 4 to 5, wherein the cost function is a function of one or more selected from: edge placement error, critical dimension, resist contour distance, worst defect size, and/or best focus shift.

20. The method of any of clauses 4 to 5, wherein the cost function is minimized by solving polynomials, including higher-order polynomials of the design variables.

21. The method of any of clauses 4 to 5, wherein at least some of the plurality of design variables are characteristics of an illumination source of the lithographic apparatus and the design layout.

22. The method of any of clauses 4 to 5, wherein the cost function is a function of a proximity effect.

23. A computer-implemented method to simulate imaging a portion of a design layout onto a substrate using a patterning device and a lithographic apparatus, the method comprising:

reducing one or more pattern displacement errors, contrast loss, best focus shift, tilt of a Bossung curve of the portion, or a combination thereof, improving exposure latitude, or enlarging depth of focus, by adjusting one or more characteristics of a data structure representing an illumination source of the lithographic apparatus;

calculating a continuous transmission map of the portion of the design layout;

generating a data structure representing the patterning device, the data structure representing one or more assist features, wherein numbers, positions, shapes or a combination thereof, of the one or more assist features are identified from the continuous transmission map.

24. The method as set forth in clause 23, further comprising placing the one or more assist features onto the patterning device.

25. A computer-implemented method to improve a lithographic process for imaging a portion of a design layout onto a substrate using a lithographic apparatus, the method comprising:

obtaining an adjustment to a phase distribution, an intensity distribution, or a combination thereof, of light diffracted from one or more main features of the portion;

deriving one or more characteristics of one or more assist features based on the adjustment.

26. The method of clause 25, further comprising implementing the one or more assist features with the one or more characteristics.

27. The method of any one of clauses 25 to 26, wherein the adjustment comprises an adjustment to amplitudes of diffraction orders of the diffracted light.

28. The method of any one of clauses 25 to 26, wherein the adjustment comprises an adjustment to relative phases of diffraction orders of the diffracted light.

29. The method of any one of clauses 25 to 28, wherein the adjustment is obtained from an optimization of the lithographic process.

30. The method of clause 29, wherein the optimization is selected from a group consisting of SMO, SMPO, SMLO, an optimization to compensate for three-dimensional effect of a patterning device, an optimization to compensate for three-dimensional effect of the substrate, an optimization to compensate for heating effect, an optimization to enlarge an overlapping process window, an optimization for increasing a yield of the lithographic process, and a combination thereof.

31. The method of clause 29, wherein the amplitude distribution, the phase distributions, parameterized characteristics of the intensity distribution, parameterized characteristics of the phase distributions, or a combination thereof are design variables in the optimization.

32. The method of any one of clauses 25 to 28, wherein the adjustment is obtained from an empirical rule, obtained from metrology data, or obtained from a database.

33. The method of any one of clauses 25 to 32, wherein the one or more characteristics comprise one or more optical characteristics of the one or more assist features, one or more geometrical characteristics of the one or more assist features, or a combination thereof.

34. The method of clause 33, wherein the one or more optical characteristics comprise transmissivity or distribution of transmissivity of the one or more assist features.

35. The method of any one of clauses 33 to 34, wherein the one or more geometrical characteristics comprise number, shape, or position of the one or more assist features.

36. A computer program product comprising a non-transitory computer readable medium having instructions recorded thereon, the instructions when executed by a computer implementing the method of any of the above clauses.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method to improve a lithographic process for imaging a portion of a design layout onto a substrate using a lithographic apparatus and a physical patterning device, the method comprising:

reducing a pattern displacement error, contrast loss, best focus shift, tilt of a Bossung curve of the portion, or a combination selected therefrom, or improving exposure latitude, or enlarging depth of focus, by adjusting a characteristic of an illumination in the lithographic apparatus;

calculating, by a hardware computer system, a continuous transmission map of the portion;

identifying numbers, positions, shapes or a combination selected therefrom, of assist features from the continuous transmission map, wherein at least two of the assist features are located in an asymmetric position with respect to a same feature of the design layout; and placing the one or more assist features onto a pattern layout for the patterning device, where the pattern layout is configured for implementation within the physical patterning device, and where the lithographic process comprises a step of physically imaging the portion of the design layout onto the substrate using the physical patterning device implementing the pattern layout.

2. The method of claim 1, comprising reducing the pattern displacement error and wherein the pattern displacement error is pattern-dependent.

3. The method of claim 1, wherein adjusting a characteristic of an illumination changes a symmetry of a shape of the illumination.

4. The method of claim 1, wherein the patterning device comprises a reflective patterning device.

5. The method of claim 1, wherein the lithographic apparatus comprises non-telecentric optics.

6. A method comprising:

reducing a pattern displacement error, contrast loss, best focus shift, tilt of a Bossung curve, or a combination selected therefrom, of a portion of a design layout for imaging onto a substrate using a physical patterning device and a lithographic apparatus, or improving exposure latitude, or enlarging depth of focus, by adjusting a characteristic of a data structure representing an illumination in the lithographic apparatus;

calculating, by a hardware computer system, a continuous transmission map of the portion of the design layout; and generating a data structure representing a pattern layout for the patterning device, the data structure representing assist features, wherein numbers, positions, shapes or a combination selected therefrom, of the assist features are identified from the continuous transmission map and at least two of the assist features are located in an asymmetric position with respect to a same feature of the design layout, where the pattern layout is configured for implementation within the physical patterning device, and where the lithographic process comprises a step of physically imaging the portion of the design layout onto the substrate using the physical patterning device implementing the pattern layout.

7. The method of claim 6, further comprising placing the assist features onto the patterning device.

8. The method of claim 6, comprising reducing the pattern displacement error and wherein the pattern displacement error is pattern-dependent.

9. The method of claim 6, wherein adjusting a characteristic of an illumination changes a symmetry of a shape of the illumination to asymmetric.

10. The method of claim 6, wherein the patterning device comprises a reflective patterning device.

11. A computer program product comprising a non-transitory computer readable medium having instructions recorded thereon, the instructions, when executed by a computer system, are configured to cause the computer system to at least:

reduce a pattern displacement error, contrast loss, best focus shift, tilt of a Bossung curve, or a combination selected therefrom, of a portion of a design layout for imaging onto a substrate using a physical patterning device and a lithographic apparatus, or improve exposure latitude, or enlarge depth of focus, by adjusting a characteristic of a data structure representing an illumination in the lithographic apparatus;

calculate a continuous transmission map of the portion of the design layout; and generate a data structure representing a pattern layout for the patterning device, the data structure representing assist features, wherein numbers, positions, shapes or a combination selected therefrom, of the assist features are identified from the continuous transmission map and at least two of the assist features are located in an asymmetric position with respect to a same feature of the design layout, where the pattern layout is configured for implementation within the physical patterning device, and where the lithographic process comprises a step of physically imaging the portion of the design layout onto the substrate using the physical patterning device implementing the pattern layout.

12. The computer program product of claim 11, wherein the instructions are configured to reduce the pattern displacement error and the pattern displacement error is pattern-dependent.

13. The computer program product of claim 11, wherein adjusting a characteristic of the illumination changes a symmetry of the illumination.

14. The computer program product of claim 11, wherein the patterning device comprises a reflective patterning device.

15. The computer program product of claim 11, wherein the lithographic apparatus comprises non-telecentric optics.

16. The computer program product of claim 11, wherein the instructions are further configured to cause placement of the one or more assist features onto the patterning device.

17. A computer program product comprising a non-transitory computer readable medium having instructions recorded thereon, the instructions, when executed by a computer system, are configured to cause the computer system to at least:

reduce a pattern displacement error, contrast loss, best focus shift, tilt of a Bossung curve, or a combination selected therefrom, of a portion of a design layout for imaging onto a substrate using a physical patterning device and the lithographic apparatus, or improve exposure latitude, or enlarge depth of focus, by adjusting a characteristic of a data structure representing an illumination in the lithographic apparatus such that the illumination has an asymmetric shape; and generate a data structure representing a pattern layout for the patterning device, the data structure representing assist features, wherein numbers, positions, shapes or a combination selected therefrom, of the assist features are identified based on the illumination and at least two of the assist features are located in an asymmetric position with respect to a same feature of the design layout, where the pattern layout is configured for implementation within the physical patterning device, and where the lithographic process comprises a step of physically imaging the portion of the design layout onto the substrate using the physical patterning device implementing the pattern layout.

18. The computer program product of claim 17, wherein the instructions are further configured to calculate a continuous transmission map of the portion of the design layout, wherein numbers, positions, shapes or a combination selected therefrom, of the assist features are identified based on a continuous transmission map.

19. The computer program product of claim 17, wherein the instructions are configured to reduce the pattern displacement error and the pattern displacement error is pattern-dependent.

20. The computer program product of claim 17, wherein the patterning device comprises a reflective patterning device.

* * * * *